(12) United States Patent
Hersam et al.

(10) Patent No.: US 9,472,686 B2
(45) Date of Patent: Oct. 18, 2016

(54) GATE-TUNABLE P-N HETEROJUNCTION DIODE, AND FABRICATION METHOD AND APPLICATION OF SAME

(71) Applicant: NORTHWESTERN UNIVERSITY, Evanston, IL (US)

(72) Inventors: Mark C. Hersam, Wilmette, IL (US); Deep M. Jariwala, Evanston, IL (US); Vinod K. Sangwan, Evanston, IL (US)

(73) Assignee: NORTHWESTERN UNIVERSITY, Evanston, IL (US)

(\*) Notice: Subject to any disclaimer, the term of this patent is extended or adjusted under 35 U.S.C. 154(b) by 0 days.

(21) Appl. No.: 14/449,690

(22) Filed: Aug. 1, 2014

(65) Prior Publication Data

US 2015/0034907 A1 Feb. 5, 2015

Related U.S. Application Data

(60) Provisional application No. 61/861,606, filed on Aug. 2, 2013.

(51) Int. Cl.
*H01L 31/00* (2006.01)
*H01L 29/861* (2006.01)
*H01L 31/0336* (2006.01)
*H01L 29/66* (2006.01)
*H01L 31/109* (2006.01)
(Continued)

(52) U.S. Cl.
CPC ..... *H01L 29/8611* (2013.01); *H01L 29/66128* (2013.01); *H01L 29/861* (2013.01); *H01L 31/0336* (2013.01); *H01L 31/109* (2013.01); *H01L 21/02568* (2013.01); *H01L 29/0673* (2013.01)

(58) Field of Classification Search
CPC .......... H01L 29/0669; H01L 29/6609; H01L 21/02568; H01L 29/0673; H01L 29/66128; H01L 29/861; H01L 29/8611; H01L 31/0336; H01L 31/109
USPC ............................................ 257/26; 437/478
See application file for complete search history.

(56) References Cited

U.S. PATENT DOCUMENTS

| | | | |
|---|---|---|---|
| 2009/0189143 A1* | 7/2009 | Kastalsky | 257/12 |
| 2009/0267060 A1* | 10/2009 | Forrest et al. | 257/40 |
| 2010/0133483 A1* | 6/2010 | Nakashima | B82Y 30/00 252/511 |

(Continued)

OTHER PUBLICATIONS

Schwierz, F. Graphene transistors. Nat. Nanotechnol. 5, 487-496 (2010).

(Continued)

*Primary Examiner* — Duy T Nguyen
(74) *Attorney, Agent, or Firm* — Locke Lord LLP; Tim Tingkang Xia, Esq.

(57) ABSTRACT

One aspect of the invention relates to a gate-tunable p-n heterojunction diode including a vertical stacked heterojunction of two ultrathin semiconductors. In one embodiment, single-layer molybdenum disulphide of an n-type semiconductor are stacked below semiconducting single-walled carbon nanotubes of a p-type semiconductor with each of them connected to a gold electrodes to form a p-n heterojunction. The electrical properties of the p-n heterojunction can be modulated by a gate voltage applied to a gate electrode and range from an insulator to a linear-response resistor to a highly rectifying diode. The gate tunability of the p-n heterojunction also allows spectral control over the photoresponse.

33 Claims, 14 Drawing Sheets

(51) Int. Cl.
*H01L 21/02* (2006.01)
*H01L 29/06* (2006.01)

(56) References Cited

U.S. PATENT DOCUMENTS

| | | | |
|---|---|---|---|
| 2012/0003278 A1* | 1/2012 | Kirkpatrick et al. | 424/400 |
| 2012/0256181 A1* | 10/2012 | Shieh | H01L 27/142 257/57 |
| 2013/0087190 A1* | 4/2013 | Han | H01L 31/06 136/256 |

OTHER PUBLICATIONS

Jariwala, D., Sangwan, V. K., Lauhon, L. J., Marks, T. J. and Hersam, M. C. Carbon nanomaterials for electronics, optoelectronics, photovoltaics, and sensing. Chem. Soc. Rev. 42, 2824-2860 (2013).
Radisavljevic, B., Radenovic, A., Brivio, J., Giacometti, V. and Kis, A. Single-layer MoS2 transistors. Nat. Nanotechnol. 6, 147-150 (2011).
Wang, H. et al. Integrated circuits based on bilayer MoS2 transistors. Nano Lett. 12, 4674-4680 (2012).
Dean, C. et al. Boron nitride substrates for high-quality graphene electronics. Nat. Nanotechnol. 5, 722-726 (2010).
Britnell, L. et al. Field-effect tunneling transistor based on vertical graphene heterostructures. Science 335, 947-950 (2012).
Yu, W. J. et al. Vertically stacked multi-heterostructures of layered materials for logic transistors and complementary inverters. Nat. Mater. 12, 246-252 (2012).
Georgiou, T. et al. Vertical field-effect transistor based on graphene-WS2 heterostructures for flexible and transparent electronics. Nat. Nanotechnol. 8, 100-103 (2012).
Bertolazzi, S., Krasnozhon, D. and Kis, A. Nonvolatile Memory Cells Based on MoS2/Graphene Heterostructures. ACS Nano 7, 3246-3252 (2013).
Choi, M. S. et al. Controlled charge trapping by molybdenum disulphide and graphene in ultrathin heterostructured memory devices. Nat. Commun. 4, 1624 (2013).
O'connell, M. J. et al. Band gap fluorescence from individual single-walled carbon nanotubes. Science 297, 593-596 (2002).
Mak, K. F., Lee, C., Hone, J., Shan, J. and Heinz, T. F. Atomically Thin MoS2: A New Direct-Gap Semiconductor. Phys. Rev. Lett. 105, 136805 (2010).
Mak, K. F. et al. Tightly bound trions in monolayer MoS2. Nat. Mater. 12, 207-211 (2012).
Wang, Q H., Kalantar-Zadeh, K., Kis, A., Coleman, J. N. and Strano, M. S. Electronics and optoelectronics of two-dimensional transition metal dichalcogenides. Nat. Nanotechnol. 7, 699-712 (2012).
Yang, H. et al. Graphene barristor, a triode device with a gate-controlled Schottky barrier. Science 336, 1140-1143 (2012).
Britnell, L. et al. Resonant tunnelling and negative differential conductance in graphene transistors. Nat. Commun. 4, 1794 (2013).
Ponomarenko, L. et al. Tunable metal-insulator transition in double-layer graphene heterostructures. Nat. Phys. 7, 958-961 (2011).
Levendorf, M. P. et al. Graphene and boron nitride lateral heterostructures for atomically thin circuitry. Nature 488, 627-632 (2012).
Ci, L. et al. Atomic layers of hybridized boron nitride and graphene domains. Nat. Mater. 9, 430-435 (2010).
Liu, Z. et al. In-plane heterostructures of graphene and hexagonal boron nitride with controlled domain sizes. Nat. Nanotechnol. 8, 119-124 (2013).
Collins, P. G., Bradley, K., Ishigami, M. and Zettl, A. Extreme oxygen sensitivity of electronic properties of carbon nanotubes. Science 287, 1801-1804 (2000).
Sangwan, V. K. et al. Fundamental Performance Limits of Carbon Nanotube Thin-Film Transistors Achieved Using Hybrid Molecular Dielectrics. ACS Nano 6, 7480-7488 (2012).
Arnold, M. S., Green, A. A., Hulvat, J. F., Stupp, S. I. and Hersam, M. C. Sorting carbon nanotubes by electronic structure using density differentiation. Nat. Nanotechnol. 1, 60-65 (2006).
Konstantatos, G. et al. Hybrid graphene-quantum dot phototransistors with ultrahigh gain. Nat. Nanotechnol. 7, 363-368 (2012).
Britnell, L. et al. Strong Light-Matter Interactions in Heterostructures of Atomically Thin Films. Science, doi:10.1126/science.1235547 (2013).
Zhang, W. et al. Ultrahigh-Gain Phototransistors Based on Graphene-MoS2 Heterostructures. arXiv preprint arXiv:1302.1230 (2013).
Rauch, T. et al. Near-infrared imaging with quantum-dot-sensitized organic photodiodes. Nat. Photon. 3, 332-336 (2009).
Li, Y. Xu, C.-Y. and Zhen, L. Surface potential and interlayer screening effects of few-layer MoS2 nanoflakes. Appl. Phys. Lett. 102, 143110-143114 (2013).
Konstantatos, G. and Sargent, E. H. Nanostructured materials for photon detection. Nat. Nanotechnol. 5, 391-400 (2010).
Green, A. A. and Hersam, M. C. Nearly Single-Chirality Single-Walled Carbon Nanotubes Produced via Orthogonal Iterative Density Gradient Ultracentrifugation. Adv. Mater. 23, 2185-2190 (2011).
Lee, C. et al. Anomalous Lattice Vibrations of Single- and Few-Layer MoS2. ACS Nano 4, 2695-2700 (2010).
Jariwala, D. et al. Band-like transport in high mobility unencapsulated single-layer MoS2 transistors. Appl. Phys. Lett. 102, 173107-173104 (2013).
Bube, R. H. Photoelectronic properties of semiconductors. (Cambridge University Press, 1992).

* cited by examiner

US 9,472,686 B2

GATE-TUNABLE P-N HETEROJUNCTION DIODE, AND FABRICATION METHOD AND APPLICATION OF SAME

CROSS-REFERENCE TO RELATED PATENT APPLICATION

This application claims priority to and the benefit of, pursuant to 35 U.S.C. §119(e), U.S. provisional patent application Ser. No. 61/861,606, filed Aug. 2, 2013, entitled "GATE-TUNABLE CARBON NANOTUBE-MoS$_2$ HETEROJUNCTION P-N DIODE," by Mark C. Hersam et al., which is incorporated herein in its entirety by reference.

Some references, which may include patents, patent applications and various publications, are cited and discussed in the description of this invention. The citation and/or discussion of such references is provided merely to clarify the description of the invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [2] represents the 2nd reference cited in the reference list, namely, Jariwala, D., Sangwan, V. K., Lauhon, L. J., Marks, T. J. and Hersam, M. C. Carbon nanomaterials for electronics, optoelectronics, photovoltaics, and sensing. *Chem. Soc. Rev.* 42, 2824-2860 (2013).

STATEMENT AS TO RIGHTS UNDER FEDERALLY-SPONSORED RESEARCH

This invention was made with government support under grant number DMR-1121262 awarded by the National Science Foundation and under grant number N00014-11-1-0690 awarded by the Office of Naval Research. The government has certain rights in the invention.

FIELD OF THE INVENTION

The invention relates generally to heterojunction structures, and more particularly a gate-tunable diode including a vertical stacked heterojunction of two ultrathin semiconductors, and fabrication method and applications of the same.

BACKGROUND OF THE INVENTION

The background description provided herein is for the purpose of generally presenting the context of the present invention. Work of the presently named inventors, to the extent it is described in this background section, as well as aspects of the description that may not otherwise qualify as prior art at the time of filing, are neither expressly nor impliedly admitted as prior art against the present invention.

The p-n junction diode and field-effect transistor (FET) are the two most ubiquitous building blocks of modern electronics and optoelectronics. In recent years, the emergence of reduced dimensionality materials has suggested that these components can be scaled down to atomic thicknesses [1, 2]. Although high performance field-effect devices have been achieved from monolayered materials [3, 4] and their heterostructures [5-10], a p-n heterojunction diode derived from ultrathin materials is notably absent and constrains the fabrication of complex electronic and optoelectronic circuits.

In bulk semiconductor p-n junctions, the doping level is primarily controlled via diffusion or implantation of substitutional impurities, which implies minimal control over the doping profile following device fabrication. In contrast, atomically thin semiconductors can be electrostatically doped by applying a bias to a capacitively coupled gate electrode. The atomically thin structure of these materials also enables doping modulation of the overlying layers in a vertically stacked heterostructure [6]. For example, this strategy allows gapless graphene to be used in field-effect tunneling devices in combination with other layered materials [6, 8]. Vertical 2D heterostructures have also been used to create high performance MOSFETs [5], tunneling FETs [6], barristors [15], inverters [7], and memory devices [9, 10] in addition to facilitating the study of novel physical phenomena in layered materials [16, 17]. Similarly, in-plane graphene heterostructures have served as the basis of unique 2D devices [18-20]. Although the nearly perfect 2D structure and low density of states in graphene provide advantages in some heterostructure devices, its gapless nature prevents the formation of a large potential barrier for charge separation and current rectification. In particular, the lack of monolayer semiconductors with complementary (p and n) polarities has precluded the realization of a gate-tunable heterojunction p-n diode.

Therefore, a heretofore unaddressed need exists in the art to address the aforementioned deficiencies and inadequacies.

SUMMARY OF THE INVENTION

This invention, among other things, is directed to a gate-tunable p-n heterojunction diode that is created by vertical stacking of two ultrathin semiconductors.

In one aspect, the invention relates to a diode. In one embodiment, the diode includes a substrate; a layer of molybdenum disulphide (MoS$_2$) flakes having a first portion and a second portion extending from the first portion, formed on the substrate; a layer of single-walled carbon nanotubes (SWCNTs) having a first portion and a second portion extending from the first portion, formed on the substrate, such that the second portion of the layer of SWCNTs and the second portion of the layer of MoS$_2$ flakes overlap with one another to define a vertically stacked heterojunction therewith; and a first electrode and a second electrode formed on the substrate, being in contact with the first portion of the layer of MoS$_2$ flakes and the first portion of the layer of SWCNTs, respectively, such that the vertically stacked heterojunction is located between the first electrode and the second electrode.

In one embodiment, the substrate comprises a gate layer of silicon and an insulating layer of silicon oxide (SiO$_2$) formed on the gate layer, wherein the layer of MoS$_2$ flakes, the layer of SWCNTs, the first electrode and the second electrode are disposed on the insulating layer.

In one embodiment, the MoS$_2$ flakes and SWCNTs are n-type and p-type semiconductors, respectively.

In one embodiment, the layer of MoS$_2$ flakes has a monolayer thickness.

In one embodiment, the layer of SWCNTs is formed of sorted semiconducting SWCNTs.

In one embodiment, a ratio of a forward current to a reverse current of the diode varies as a function of a gate voltage applied to the gate layer.

In one embodiment, electrical characteristics of the diode are tunable with the applied gate voltage over a wide range of charge transport behavior ranging from insulating to rectifying with the forward-to-reverse bias current ratio exceeding $10^4$.

In one embodiment, the diode is capable of functioning as an insulator, a linear-response resistor, or a highly rectifying diode, in response to the applied gate voltage.

In one embodiment, the diode has an optical response to optical illumination of light at a wavelength ranging from near-infrared wavelength to a visible wavelength.

In one embodiment, the diode has a photoresponse time that is less than about 15 µs, and an external quantum efficiency (EQE) that is greater than about 25%.

In another aspect of the invention, the diode has a substrate; a first semiconductor layer having a first portion and a second portion extending from the first portion, formed on the substrate; and a second semiconductor layer having a first portion and a second portion extending from the first portion, formed on the substrate, such that the second portion of the second semiconductor layer and the second portion of the first semiconductor layer overlap with one another to define a vertically stacked heterojunction therewith; and a first electrode and a second electrode formed on the substrate, being in contact with the first portion of the first semiconductor layer and the first portion of the second semiconductor layer, respectively, such that the vertically stacked heterojunction is located between the first electrode and the second electrode.

In one embodiment, the substrate comprises a gate layer of silicon and an insulating layer of $SiO_2$ formed on the gate layer, wherein the first semiconductor layer, the second first semiconductor layer, the first electrode and the second electrode are disposed on the insulating layer.

In one embodiment, one of the first semiconductor layer and the second semiconductor layer is formed of an n-type semiconductor, and the other of the first semiconductor layer and the second semiconductor layer is formed of a p-type semiconductor.

In one embodiment, each of the first semiconductor layer and the second semiconductor layer is formed of an atomically thin semiconductor.

In one embodiment, each of the first semiconductor layer and the second semiconductor layer has a monolayer thickness.

In one embodiment, the n-type semiconductor has a band gap that is larger than that of the p-type semiconductor.

In one embodiment, the n-type semiconductor comprises $MoS_2$ flakes, and the p-type semiconductor comprises SWCNTs.

In one embodiment, the SWCNTs comprise sorted semiconducting SWCNTs.

In one embodiment, a ratio of a forward current to a reverse current of the diode varies as a function of a gate voltage applied to the gate layer.

In one embodiment, electrical characteristics of the diode are tunable with the applied gate voltage over a wide range of charge transport behavior ranging from insulating to rectifying with the forward-to-reverse bias current ratio exceeding $10^4$.

In one embodiment, the diode is capable of functioning as an insulator, a linear-response resistor, or a highly rectifying diode, in response to the applied gate voltage.

In one embodiment, the diode has an optical response to optical illumination of light at a wavelength ranging from near-infrared wavelength to a visible wavelength.

In one embodiment, the diode has a photoresponse time that is less than about 15 µs, and an EQE that is greater than about 25%.

In one aspect, the invention relates to an electronic device having at least one diode as disclosed above.

In another aspect, the invention relates to a photodetector having at least one diode as disclosed above.

In yet another aspect, the invention relates to a heterojunction structure In one embodiment, the heterojunction structure includes a first semiconductor layer and a second semiconductor layer stacked on the first semiconductor to define a vertically stacked heterojunction on a substrate, where one of the first semiconductor layer and the second semiconductor layer is formed of an n-type semiconductor, and the other of the first semiconductor layer and the second semiconductor layer is formed of a p-type semiconductor. Each of the first semiconductor layer and the second semiconductor layer is formed of an atomically thin semiconductor In one embodiment, each of the first semiconductor layer and the second semiconductor layer has a monolayer thickness.

In one embodiment, the n-type semiconductor has a band gap that is larger than that of the p-type semiconductor.

In one embodiment, the n-type semiconductor comprises $MoS_2$ flakes, and the p-type semiconductor comprises SWCNTs.

In one embodiment, the substrate comprises a gate layer and an insulating layer formed on the gate layer, wherein the first semiconductor layer and the second first semiconductor layer are disposed on the insulating layer.

In one embodiment, a ratio of a forward current to a reverse current of the heterojunction structure varies as a function of a gate voltage applied to the gate layer.

In one embodiment, electrical characteristics of the heterojunction structure are tunable with the applied gate voltage over a wide range of charge transport behavior ranging from insulating to rectifying with the forward-to-reverse bias current ratio exceeding $10^4$.

In one embodiment, the heterojunction structure is capable of functioning as an insulator, a linear-response resistor, or a highly rectifying diode, in response to the applied gate voltage.

In one embodiment, the heterojunction structure has an optical response to optical illumination of light at a wavelength ranging from near-infrared wavelength to a visible wavelength.

In one embodiment, the heterojunction structure has a photoresponse time that is less than about 15 µs, and an EQE that is greater than about 25%.

In one aspect, the invention relates to an electronic device having at least one heterojunction structure as disclosed above.

In another aspect, the invention relates to a photodetector having at least one heterojunction structure as disclosed above.

In another aspect, the invention relates to a method of fabricating a diode. In one embodiment, the method comprising the steps of forming a first semiconductor layer on a substrate, wherein the first semiconductor layer has a first portion and a second portion extending from the first portion; forming a first electrode and a second electrode on the substrate, wherein the first electrode extends over and is in contact with the first portion of the first semiconductor layer; forming an insulting film to cover the first electrode and the first portion of the first semiconductor layer; and forming a second semiconductor layer on the substrate, wherein the second semiconductor layer has a first portion and a second portion extending from the first portion, the second portion of the second semiconductor layer overlapping with the second portion of the first semiconductor layer to define a vertically stacked heterojunction therewith, and the first portion of the second semiconductor layer extending over and being in contact with the second electrode. Each of the first semiconductor layer and the second semiconductor layer comprises an atomically thin semiconductor In one embodiment, at least one of the first semiconductor layer and the second semiconductor layer has a monolayer thickness.

In one embodiment, one of the first semiconductor layer and the second semiconductor layer is formed of an n-type semiconductor, and the other of the first semiconductor layer and the second semiconductor layer is formed of a p-type semiconductor.

In one embodiment, the n-type semiconductor has a band gap that is larger than that of the p-type semiconductor.

In one embodiment, the n-type semiconductor comprises $MoS_2$ flakes, and the p-type semiconductor comprises SWCNTs.

These and other aspects of the invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 3A shows gate-tunable output characteristics showing the transition from a nearly insulating state at $V_G$=70 V to a conductive state with relatively poor rectification at $V_G$=40 V to a highly rectifying diode behavior at negative gate voltages. FIG. 3B shows transfer characteristics of the p-n heterojunction (223), showing an 'anti-ambipolar' characteristic, which is qualitatively a superposition of the transfer characteristics of the p-type s-SWCNT FET (221) and n-type SL-$MoS_2$ FET (222). FIG. 3C shows a forward-to-reverse current ratio (at a heterojunction bias magnitude of about 10 V) as a function of a gate bias. The labels at the top show the corresponding band diagrams for the s-SWCNT/SL-$MoS_2$p-n heterojunction. At a high positive gate bias, the formation of an $n^+$-n junction implies a low rectification ratio that transitions into an $n^+$-i junction (plateau region in the plot) with reducing $V_G$. The rectification ratio then rises with decreasing gate bias due to the formation of a p-n heterojunction. FIG. 3D shows gate-tunable rectification using the p-n heterojunction diode. The y-axis on the left shows the input voltage while the y-axis on the right shows the output voltage across the series resistor (1 MΩ). As a function of the gate bias, the device evolves from a non-rectifying resistor-like state at $V_G$=10 V (241) to a diode-like rectifying state at $V_G$=–10 V (242).

DETAILED DESCRIPTION OF THE INVENTION

Figure 1:
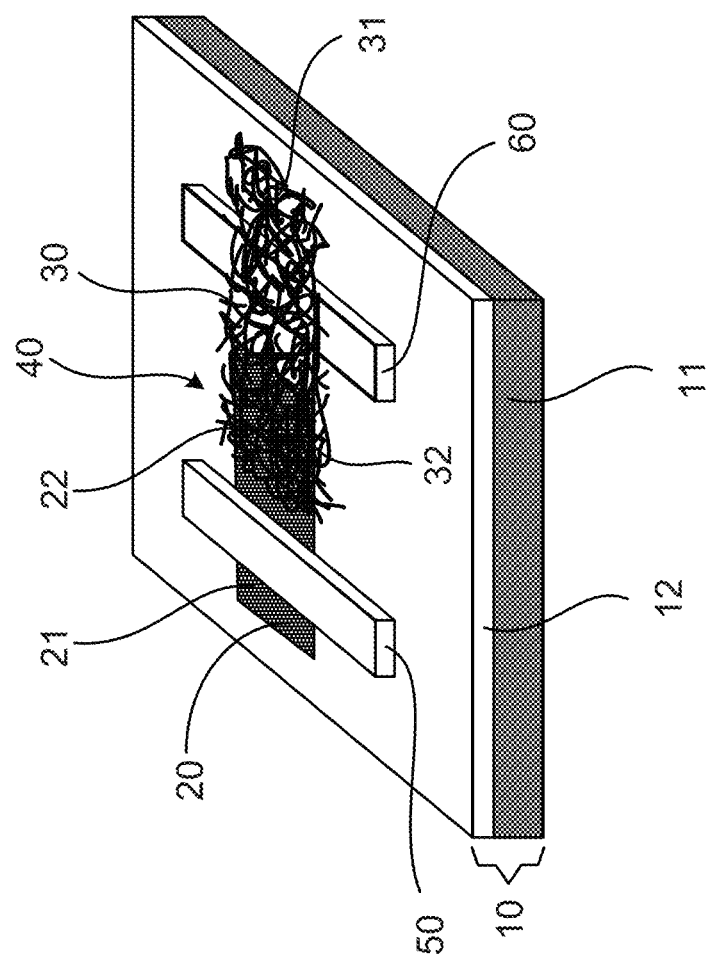
FIG. 1 shows schematically a heterojunction diode according to one embodiment of the present invention.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having", or "carry" and/or "carrying," or "contain" and/or "containing," or "involve" and/or "involving, and the like are to be open-ended, i.e., to mean including but not limited to. When used in this disclosure, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The description will be made as to the embodiments of the invention in conjunction with the accompanying drawings. In accordance with the purposes of this disclosure, as embodied and broadly described herein, this disclosure, in one aspect, relates to a gate-tunable p-n heterojunction diode including a vertical stacked heterojunction of two ultrathin semiconductors, and fabrication method and applications of the same. According to the invention, among other things, the key innovations are fabrication of a p-n heterojunction from atomically thin materials, and a p-n heterojunction whose electrical properties and photoresponse can be tuned by a gate voltage.

Referring to FIG. 1, a gate-tunable diode including a vertical stacked heterojunction of two ultrathin semiconductors is schematically shown according to one embodiment of the invention. In this exemplary embodiment, the diode includes a substrate 10, and a heterojunction structure having a first semiconductor layer 20 and a second semiconductor layer 30 stacked on the first semiconductor 20 to define a vertically stacked heterojunction 40 on the substrate 10. The substrate 10 has a gate layer 11 and an insulating layer 12 formed on the gate layer 11. In certain embodiments, the gate layer 11 is a silicon layer, and the insulating layer is a silicon oxide ($SiO_2$) layer.

The first semiconductor layer 20 has a first portion 21 and a second portion 22 extending from the first portion 21, formed on the substrate 10. The second semiconductor layer 30 has a first portion 31 and a second portion 32 extending from the first portion 31, formed on the substrate 10. The second portion 32 of the second semiconductor layer 30 and the second portion 22 of the first semiconductor layer 20 overlap with one another to define the vertically stacked heterojunction 40 therewith on the substrate 10.

In one embodiment, the first semiconductor layer 20 and/or the second semiconductor layer 30 are formed of atomically thin materials, such as nanotubes, nanofibers, or a combination thereof.

In one embodiment, one of the first semiconductor layer 20 and the second semiconductor layer 30 is formed of an n-type semiconductor, and the other of the first semiconductor layer 20 and the second semiconductor layer 30 is formed of a p-type semiconductor. The n-type semiconductor has a band gap that is larger than that of the p-type semiconductor.

Further, the diode includes a first electrode 50 and a second electrode 60 formed on the substrate 10, which are in contact with the first portion 21 of the first semiconductor layer 20 and the first portion 31 of the second semiconductor layer 30, respectively. As such, the vertically stacked heterojunction 40 is located between the first electrode 50 and the second electrode 60. In certain embodiments, the first electrode 50 and the second electrode 60 are formed of gold, silver, copper, or the like.

As shown in FIG. 1, the first semiconductor layer 20, the second first semiconductor layer, the first electrode 50 and the second electrode 60 are located on the insulating layer 12.

According to the invention, the first semiconductor layer 20 and the second semiconductor layer 30 are of ultrathin layers having a monolayer thickness. The ultrathin nature of the heterojunction allows the gate tunability of the diode electrical characteristics.

The diode can be characterized with a ratio of a forward current to a reverse current. According to the invention, the forward-to-reverse current ratio varies as a function of a gate voltage applied to the gate layer. The electrical characteristics of the diode are tunable with the applied gate voltage over a wide range of charge transport behavior ranging from insulating to rectifying with the forward-to-reverse bias current ratio exceeding $10^4$. As a result, the diode is capable of functioning as an insulator, a linear-response resistor, or a highly rectifying diode, in response to the applied gate voltage.

In addition, the diode has an optical response to optical illumination of light at a wavelength ranging from near-infrared wavelength to a visible wavelength. The diode has a photoresponse time that is less than about 15 μs, and an external quantum efficiency (EQE) that is greater than about 25%.

In one embodiment, the gate-tunable p-n heterojunction diode uses semiconducting single-walled carbon nanotubes (s-SWCNTs) and single-layer molybdenum disulphide (SL-$MoS_2$) as p-type and n-type semiconductors, respectively. In particular, SL-$MoS_2$ which is n-type semiconductor is stacked below p-type semiconducting s-SWCNTs with each of them connected to gold electrodes to form a p-n heterojunction. The vertical stacking of these two direct band gap [11-13] semiconductors forms a heterojunction with electrical characteristics that can be tuned with an applied gate bias over a wide range of charge transport behavior ranging from insulating to rectifying with forward-to-reverse bias current ratios exceeding $10^4$. The gate tunability also allows spectral control over the photoresponse. In addition, the band gaps of the carbon nanotubes (about 0.5 eV) and $MoS_2$ (about 1.8 eV) allow concurrent optical response at near-infrared and visible wavelengths. This heterojunction diode also responds strongly to optical irradiation with an EQE of about 25% and fast photoresponse being less than 15 μs. Since SWCNTs have a diverse range of electrical properties as a function of chirality and an increasing number of atomically thin 2D nanomaterials are being isolated [14], the gate-tunable p-n heterojunction should be widely generalizable to realize diverse ultrathin, high performance electronics and optoelectronics.

In one aspect, the invention relates to a method of fabricating a diode. In one embodiment, the method comprising the steps of forming a first semiconductor layer on a substrate, wherein the first semiconductor layer has a first portion and a second portion extending from the first portion; forming a first electrode and a second electrode on the substrate, wherein the first electrode extends over and is in contact with the first portion of the first semiconductor layer; forming an insluting film to cover the first electrode and the first portion of the first semiconductor layer; and forming a second semiconductor layer on the substrate, wherein the second semiconductor layer has a first portion and a second portion extending from the first portion, the second portion of the second semiconductor layer overlapping with the second portion of the first semiconductor layer to define a vertically stacked heterojunction therewith, and the first portion of the second semiconductor layer extending over and being in contact with the second electrode.

In one embodiment, each of the first semiconductor layer and the second semiconductor layer is formed of atomically thin materials and has a monolayer thickness.

In one embodiment, one of the first semiconductor layer and the second semiconductor layer is formed of an n-type semiconductor, and the other of the first semiconductor layer and the second semiconductor layer is formed of a p-type semiconductor.

In one embodiment, the n-type semiconductor has a band gap that is larger than that of the p-type semiconductor. The n-type semiconductor comprises SL-MoS$_2$, and the p-type semiconductor comprises s-SWCNTs.

In one aspect, the invention relates to an electronic device having at least one diode as disclosed above.

In another aspect, the invention relates to a photodetector having at least one diode as disclosed above.

Without intent to limit the scope of the invention, examples and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Materials and Device Fabrication

Figure 2A:
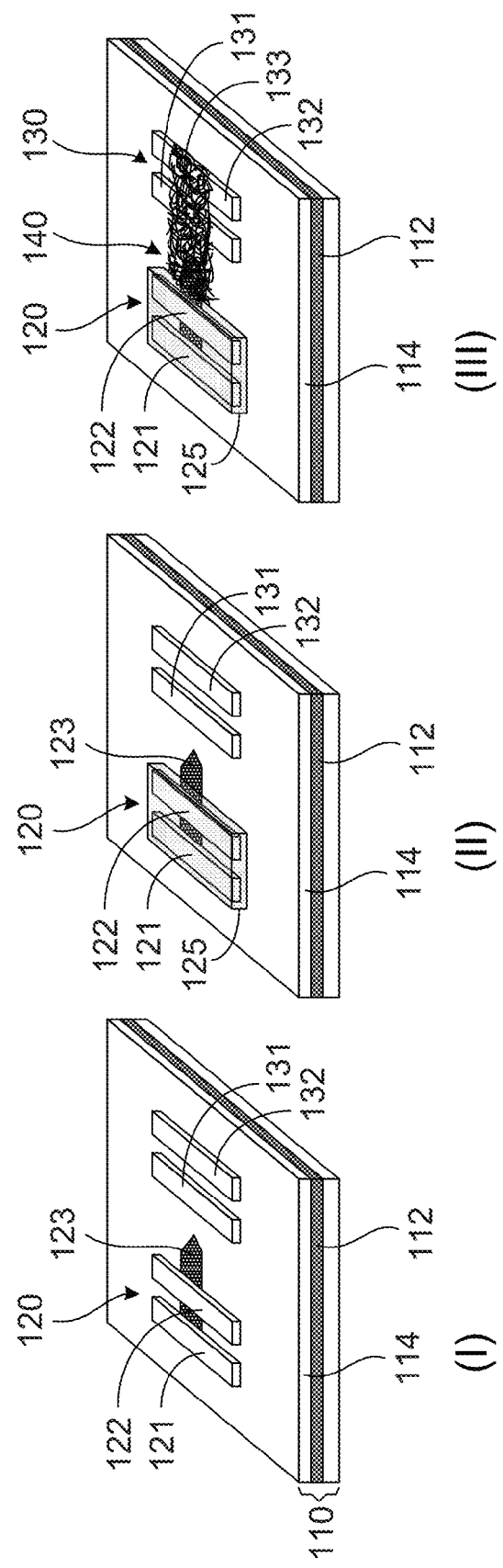
FIG. 2A shows schematically a fabrication process of an s-SWCNTs/SL-$MoS_2$ p-n heterojunction diode according to one embodiment of the present invention. (I) SL-$MoS_2$ FET and an extra pair of electrodes are fabricated via e-beam lithography on 300 nm $SiO_2$/Si. The Si substrate acts as a global back gate. (II) The $MoS_2$ FET is insulated by patterning an alumina film in a liftoff process, followed by (III) transfer and patterning of the s-SWCNT network to yield the final device configuration including a top contact SL-$MoS_2$ FET, a bottom contact s-SWCNT FET, and a p-n heterojunction.

FIG. 2A shows schematically a fabrication process of an s-SWCNTs/SL-MoS$_2$ p-n heterojunction diode according to one exemplary embodiment of the present invention. The device fabrication begins by depositing and e-beam lithographically defining gold electrodes on SL-MoS$_2$ flakes that are exfoliated on a 300 nm SiO$_2$/Si wafer. (I) SL-MoS$_2$ FET 120 and an extra pair of electrodes 131 and 132 are fabricated via e-beam lithography on the 300 nm SiO$_2$/Si wafer 110. The MoS$_2$ FET 120 includes a monolayer of MoS$_2$ flakes 123 deposited on the SiO$_2$/Si wafer 110 and a pair of electrodes 121 and 122 formed on the monolayer of MoS$_2$ flakes 123 and the SiO$_2$/Si wafer 110. The Si substrate 112 acts as a global back gate. (II) The MoS$_2$ FET 120 is insulated by patterning an alumina film 125 via atomic layer deposition (ALD) in a liftoff process, followed by (III) transfer and patterning of the sorted s-SWCNT thin film 133 [22, 23] to yield the final device configuration including a top contact SL-MoS$_2$ FET 130, a bottom contact s-SWCNT FET 120, and a p-n heterojunction 140.

Figures 2B, 2C:
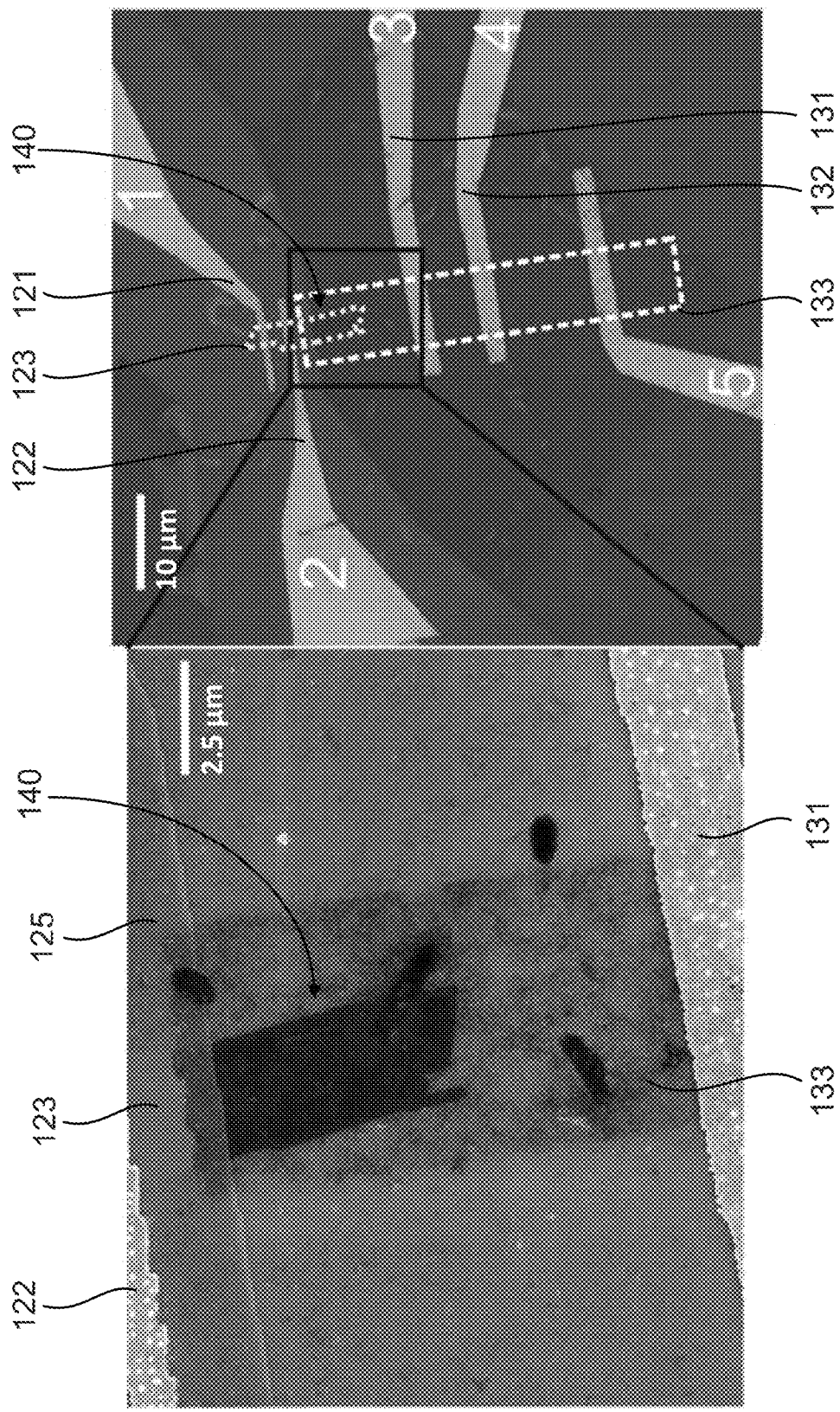
FIG. 2B shows false-colored scanning electron microscopy (SEM) image of an s-SWCNTs/SL-$MoS_2$ p-n heterojunction diode according to one embodiment of the present invention. Regions 122 and 131 at the top and bottom are the gold electrodes. The patterned alumina (region 125) serves as a mask for insulating a portion of the SL-$MoS_2$ flake (region 123). Region 133 is the patterned random network of s-SWCNTs (p-type) in direct contact with the exposed part of SL-$MoS_2$ flake (n-type) to form the p-n heterojunction diode (140).
FIG. 2C shows optical micrograph showing the s-SW-CNTs/SL-$MoS_2$ p-n heterojunction diode of FIG. 2B at a lower magnification. The dashed boundary 123 indicates the SL-$MoS_2$ flake while the dashed rectangle 133 denotes the patterned s-SWCNT film. Electrodes 1 and 2 form the n-type SL-$MoS_2$ FET, which is insulated by the patterned alumina film (123). Electrodes 2-3 form the p-n heterojunction while electrodes 3-4 and electrodes 4-5 form p-type s-SWCNT FETs.

FIG. 2B shows false-colored scanning electron microscopy (SEM) image of an s-SWCNTs/SL-MoS$_2$ p-n heterojunction diode according to one embodiment of the present invention. Regions 122 and 131 at the top and bottom are the gold electrodes. The patterned alumina 125 serves as a mask for insulating a portion of the SL-MoS$_2$ flake 123. The patterned random network of s-SWCNTs 133 (p-type) is in direct contact with the exposed part of SL-MoS$_2$ flake 123 (n-type) to form the p-n heterojunction 140.

FIG. 2C shows optical micrograph showing the s-SWCNTs/SL-MoS$_2$ p-n heterojunction diode of FIG. 2B at a lower magnification. The dashed boundary 123 indicates the SL-MoS$_2$ flake while the dashed rectangle 133 denotes the patterned s-SWCNT film. Electrodes 1 and 2 form the n-type SL-MoS$_2$ FET, which is insulated by the patterned alumina film 123. Electrodes 2-3 form the p-n heterojunction while electrodes 3-4 and electrodes 4-5 form p-type s-SWCNT FETs.

Raman Spectroscopy of MoS$_2$

Figure 6:
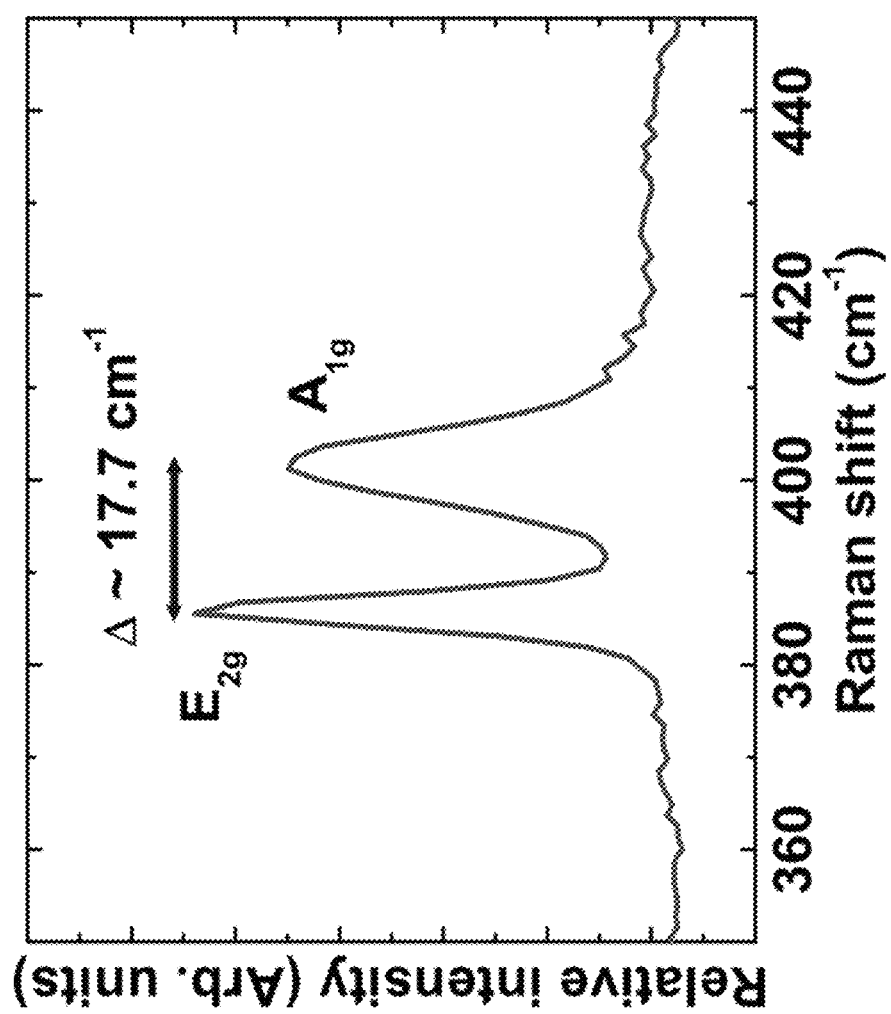
FIG. 6 shows a Raman spectrum of a representative $MoS_2$ flake. A separation of 17.7 $cm^{-1}$ between $E_{2g}$ and $A_{1g}$ indicates a monolayer thickness.

Monolayers of MoS$_2$ were confirmed via Raman spectroscopy. The Raman spectra were acquired using a 532 nm laser with a 100× objective (NA=0.9) in a scanning confocal microscope (WITec Alpha300 R). The separation ($\Delta$) between $E_{2g}$ and $A_{1g}$ modes of MoS$_2$ is a well-known parameter for identifying layer thickness in ultrathin MoS$_2$ flakes. Typically, a $\Delta$ value less than about 20 cm$^{-1}$ indicates a single layer sample [31]. FIG. 6 shows the Raman spectrum of an exemplary MoS$_2$ flake that was fabricated into the p-n heterojunction device, where A is about 17.7 cm$^{-1}$. A separation of 17.7 cm$^{-1}$ between $E_{2g}$ and $A_{1g}$ clearly indicates a monolayer thickness of the exemplary MoS$_2$ flake.

Sorting and Deposition of Semiconducting SWCNTs

Figure 7:
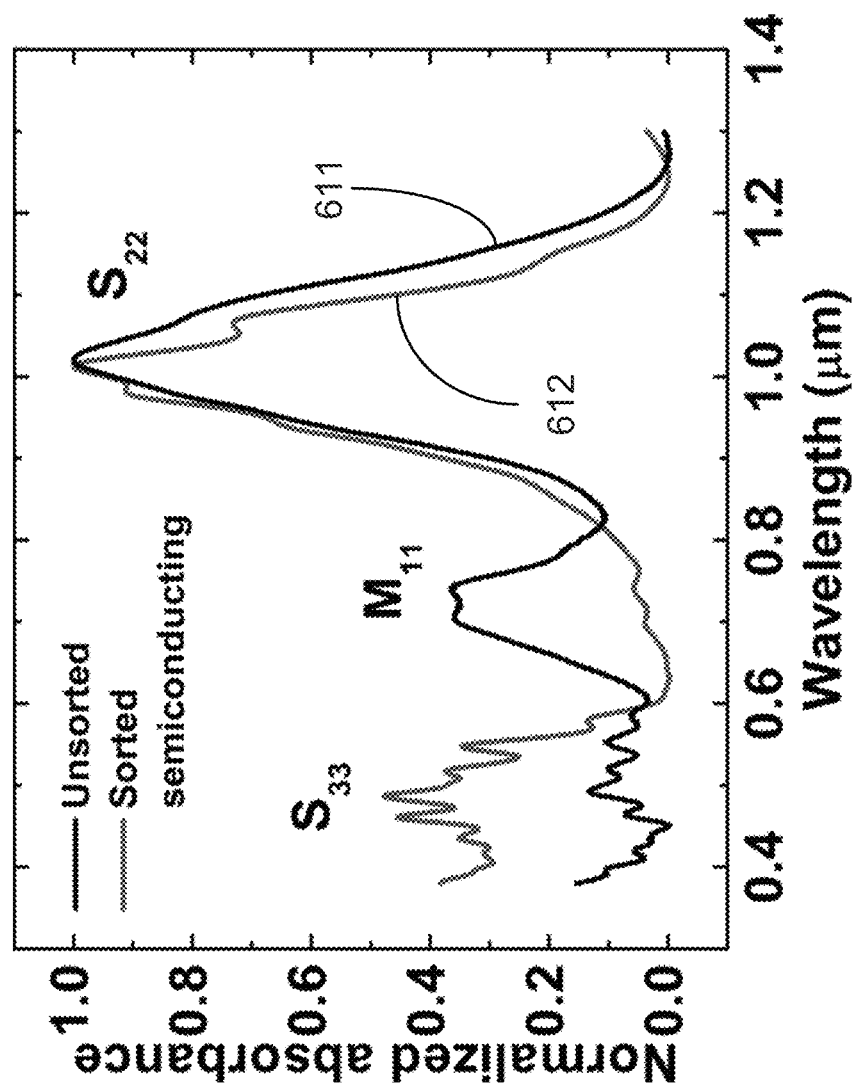
FIG. 7 shows normalized optical absorbance spectra of arc discharge SWCNTs. The unsorted SWCNTs (611) possess a mixture of metallic and semiconducting species as evidenced by the presence of both semiconducting ($S_{22}$ and $S_{33}$) and metallic ($M_{11}$) peaks, while the spectrum of the sorted semiconducting SWCNTs (612) shows strong semiconducting peaks and negligible metallic peaks.

Semiconducting SWCNTs with about 99% semiconductor purity were isolated by density gradient ultracentrifugation following the procedure discussed in a previous report [22]. SWCNT thin films were prepared by vacuum filtration and transferred onto pre-patterned Au electrodes by the acetone bath transfer method as outlined in the literature [22, 30]. The semiconducting purity of the sorted SWCNTs was estimated using the optical absorbance characterization and analysis protocol developed earlier [23, 30]. FIG. 7 shows the optical absorbance spectra for as-purchased arc-discharge SWCNTs (P2, Carbon Solutions Inc.) and sorted about 99% semiconductor purity SWCNTs. The average diameter of the semiconducting SWCNTs is 1.4 nm. The unsorted SWCNTs 611 possess a mixture of metallic and semiconducting species as evidenced by the presence of both semiconducting ($S_{22}$ and $S_{33}$) and metallic ($M_{11}$) peaks, while the spectrum of the sorted semiconducting SWCNTs 612 shows strong semiconducting peaks and negligible metallic peaks.

Device Fabrication

All devices were fabricated on 300 nm thick SiO$_2$/Si substrates. The Si <100> wafers were purchased from Silicon Quest International. The wafers were doped n-type with As (resistivity=0.001-0.005 $\Omega$-cm). The MoS$_2$ FETs were fabricated using previously reported techniques [32]. Specifically, bulk MoS$_2$ crystals were purchased from SPI Supplies and mechanically exfoliated using scotch tape. The MoS$_2$ flakes were identified using an optical microscope (Olympus BX 51M) and then subjected to electron-beam lithography (EBL). A two-step EBL process was adopted to fabricate Au contacts with no adhesion layer. The patterns in the first step were designed to be just short of touching the MoS$_2$ flakes. Au (75 nm thick) is the metal in contact with the MoS$_2$ flake. Following liftoff in acetone, the devices were further cleaned with remover PG (Microchem) at about 60° C. for about 1 hour.

Figure 8:
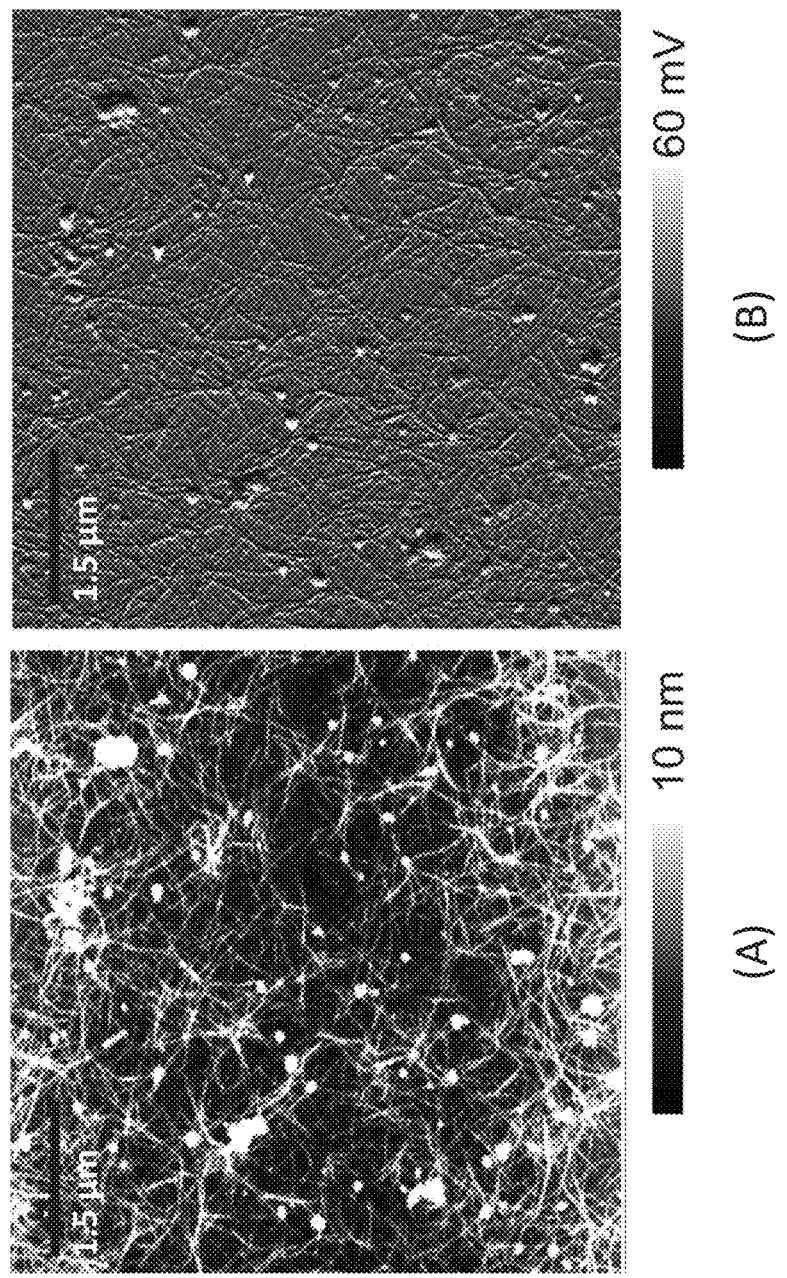
FIG. 8 shows atomic force microscopy (AFM) images of the SWCNT film. (A) Topographic image and (B) amplitude error show the random network morphology and uniform coverage of SWCNTs (scale bar=1.5 µm).

A portion of the MoS$_2$ FET including both the contacts and channel was exposed in a subsequent step of EBL. Atomic layer deposition (ALD) (Cambridge Nanotech, Savannah S100) was used to grow about 30 nm alumina at about 100° C. to insulate the MoS$_2$ channel and contacts, thus prevent shorting following subsequent SWCNT deposition. Trimethyl aluminum (TMA) (Aldrich, 99%) was used as the precursor for ALD growth of alumina, and ultrahigh purity nitrogen (Airgas) was used as the purging gas. A single ALD cycle included a TMA pulse for about 0.015 s and a 30 s purge, followed by a H$_2$O pulse for 0.015 s and a second 30 s purge. The growth rate was determined to be about 0.75 Å/cycle. A total of about 400 cycles was performed to achieve about 30 nm thickness. The oxide was lifted off in warm acetone at about 50° C. for about 1 hour. A cellulose membrane containing the semiconducting SWCNT film was then stamped onto the entire substrate and dissolved under acetone vapor as outlined in previous reports [22]. The SWCNT film was annealed in vacuum (50 mTorr) at about 200° C. for about 1 hour and then patterned with EBL using a ZEP 150 (Nippon Zeon) resist. Reactive ion etching (Samco RIE-10 NR) in an oxygen plasma atmosphere (100 mW, 15 sec, 20 sccm) was then used to etch the nanotubes. The resist was subsequently dissolved in heated (80 C) N-methyl-2-pyrrolidone for about 6 hours. The SWCNT film morphology close to the heterojunction region was characterized using atomic force microscopy (AFM), as shown in FIG. 8, where (A) topographic image and (B) amplitude error show the random network morphology and uniform coverage of SWCNTs (scale bar=1.5 μm).

Device Characterization

Transfer Characteristics of the p-n Heterojunction Diode

In this exemplary embodiment, the output and transfer characteristics of the p-n heterojunction diode were measured using Keithley 2400 source meters and custom LabView programs.

Figures 3A, 3B:
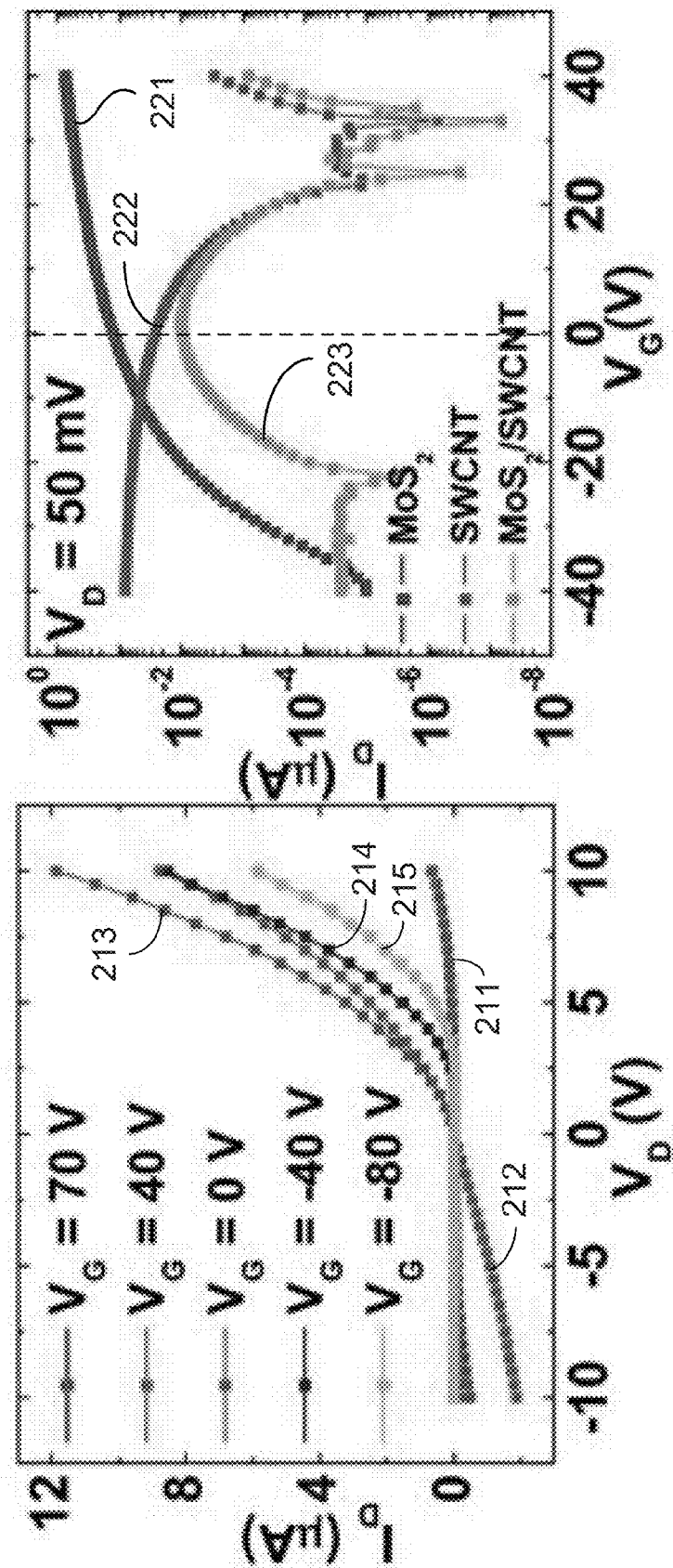
FIGS. 3A-3D shows electrical properties of an s-SWCNT/SL-$MoS_2$ p-n heterojunction device according to one embodiment of the present invention.
Figure 9:
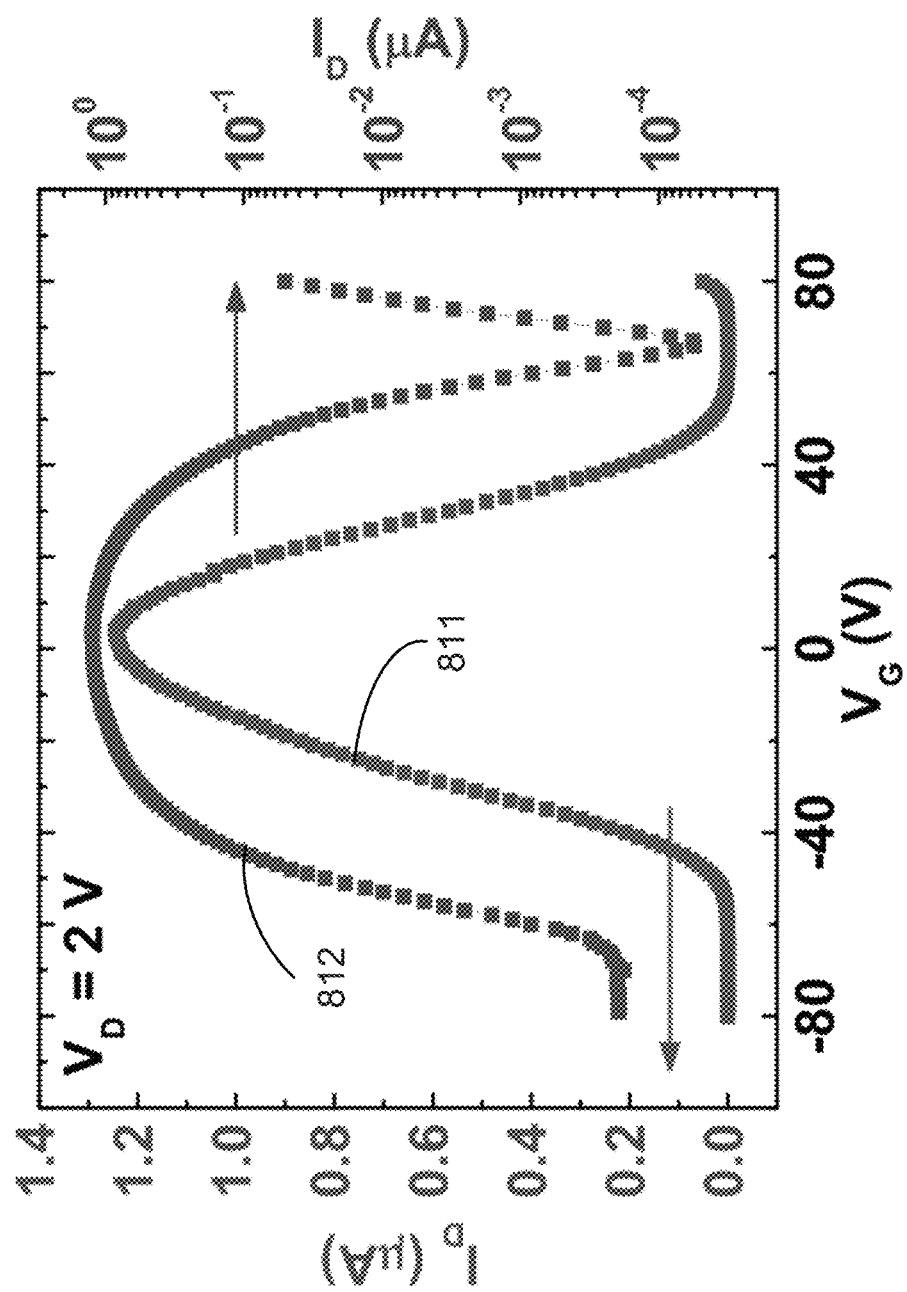
FIG. 9 shows linear (811) and semi-log (812) transfer characteristics of the exemplary p-n heterojunction diode showing 'anti-ambipolar' behavior and on/off ratio exceeding $10^4$.

The ultrathin nature of the heterojunction allows the gate tunability of the diode electrical characteristics. FIG. 3A shows the output plots 211-215 of the p-n heterojunction diode under different gate biases $V_G$=70 V, 40 V, 0 V, −40 V, and −80 V, respectively. The p-n heterojunction diode transitions from a nearly insulating behavior at $V_G$=70 V to a poorly rectifying state ($r^2$<60% for fits to the Shockley diode equation) at $V_G$=40 V to a highly rectifying diode for $V_G \le 0$ V ($r^2$>99%). The transfer plot further demonstrates the gate tunability of the current through the p-n heterojunction, as shown in FIG. 3B, where the gate voltage $V_G$ was swept at 10 V/sec in steps of 1 V in the transfer and output plots. The transfer characteristics 223 of the heterojunction can be qualitatively viewed as a superposition of the transfer plots of the p-type s-SWCNT FET 222 and n-type SL-MoS$_2$ FET 221. However, the net current through the heterojunction is smaller than the SL-MoS$_2$ and s-SWCNT FET transfer characteristics due to the additional resistance at the heterojunction. The transfer characteristics 223 of the heterojunction shows an unusual gate voltage dependence, which refers to as 'anti-ambipolar' behavior. In particular, the maximum conductance occurs near $V_G$=0, which is the opposite of conventional ambipolar behavior that shows a minimum conductance near $V_G$=0. The current on/off ratio exceeds $10^4$ in the transfer plots, which is suitable for advanced logic applications. FIGS. 9A and 9B respectively show the linear transfer characteristics 811 and the semi-log transfer characteristics 812 of the exemplary p-n heterojunction diode showing 'anti-ambipolar' behavior and on/off ratio exceeding $10^4$.

Figure 3C:
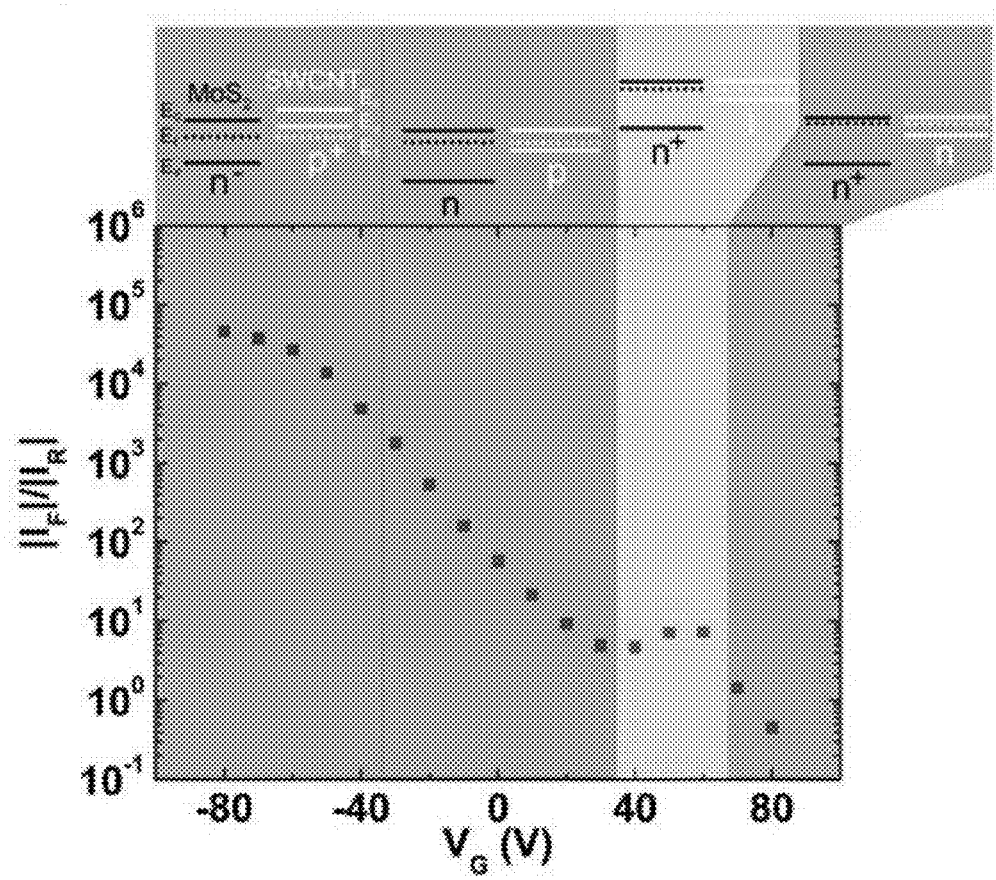

An important parameter in characterizing the diode characteristics is the ratio of the forward current, |I$_f$|, to the reverse current, |I$_r$|, at the same bias magnitude. FIG. 3C shows that |I$_f$|/|I$_r$| varies by over five orders of magnitude as a function of gate voltage. Between the two gate bias extremes, the s-SWCNT/SL-MoS$_2$ heterojunction transitions from an n-n$^+$ junction at $V_G$=80 V to a p-n junction at $V_G$=−80 V. The large band gap of SL-MoS$_2$ (greater than 1.8 eV) [13] compared to the s-SWCNTs (about 0.7 eV) allows electrostatic depletion of SL-MoS$_2$ to a lightly n doped (n$^-$) or nearly intrinsic insulating state, thereby leading to |I$_f$|/|I$_r$| values exceeding $10^4$ at $V_G$=−80 V. On the other hand, the small band gap of the s-SWCNTs allows electrostatic inversion from p-doping to n-doping at large positive $V_G$, resulting in poor |I$_f$|/|I$_r$| values for $V_G$>60 V.

The diode output curves with varying gate bias ($V_G$) were fit with the Shockley diode equation, $$|I_D| = |I_{rs}|\left(e^{\frac{eV_D}{nk_BT}} - 1\right),$$

where $I_D$ is the drain current, $V_D$ is the drain bias, $I_{rs}$ is the reverse saturation current at $V_D$=−0.05 V, e is the electronic charge, n is the ideality factor, $k_B$ is the Boltzmann constant, and T is the temperature of operation (about 300 K).

Figure 10:
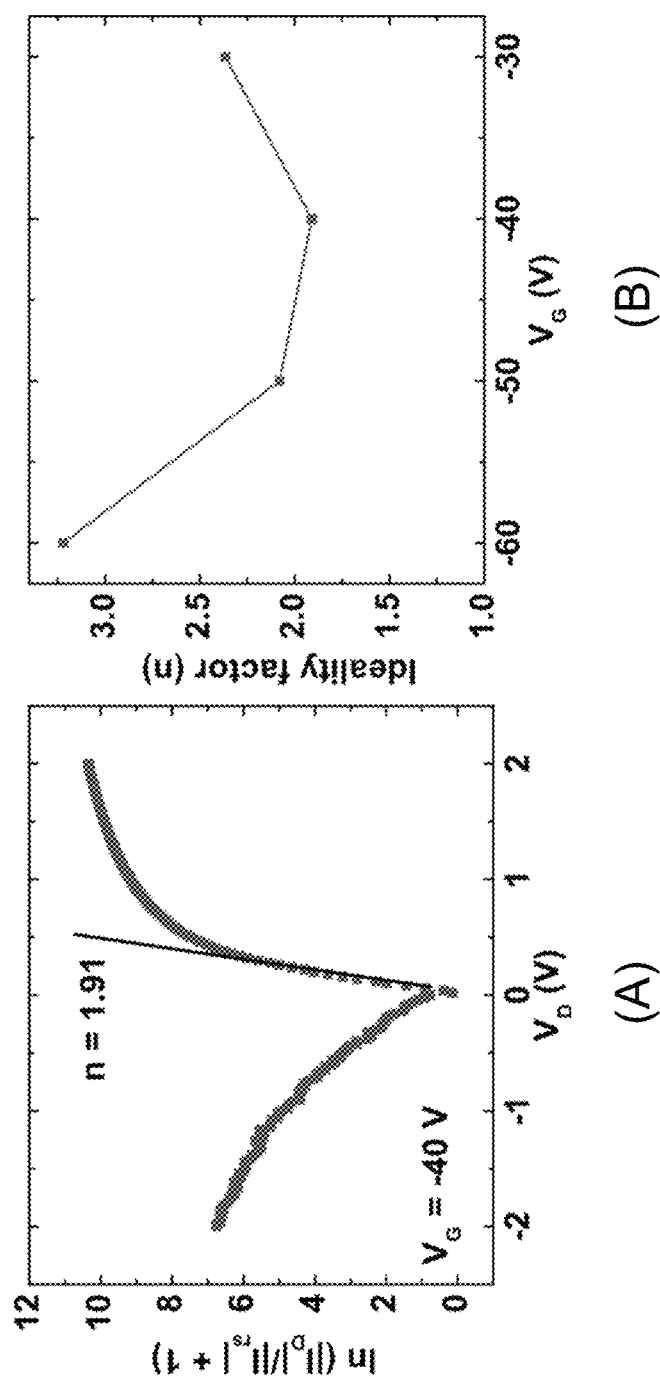
FIG. 10 shows (A) Shockley diode equation fit to the output curve at $V_G$=−40 V, (B) the variation of n with $V_G$ shows that the diode is closest to ideal behavior at $V_G$=−40 V.

To further understand the gate-dependent modulation of the heterojunction I-V curves, it was fitted to the Shockley diode equation. FIG. 10 shows (A) Shockley diode equation fit to the output curve at $V_G$=−40 V, (B) the variation of n with $V_G$ shows that the diode is closest to ideal behavior at $V_G$=−40 V. The best fit to the diode curve ($r^2$>99%) was achieved for $V_G$ values ranging from −30 to −60 V with the diode ideality factor (n) approaching closest to 1 at −40 V (FIG. 10). For other $V_G$ values, either the diode ideality factor (n) was >3 or the fits were poor ($r^2$<60%).

Figure 3D:
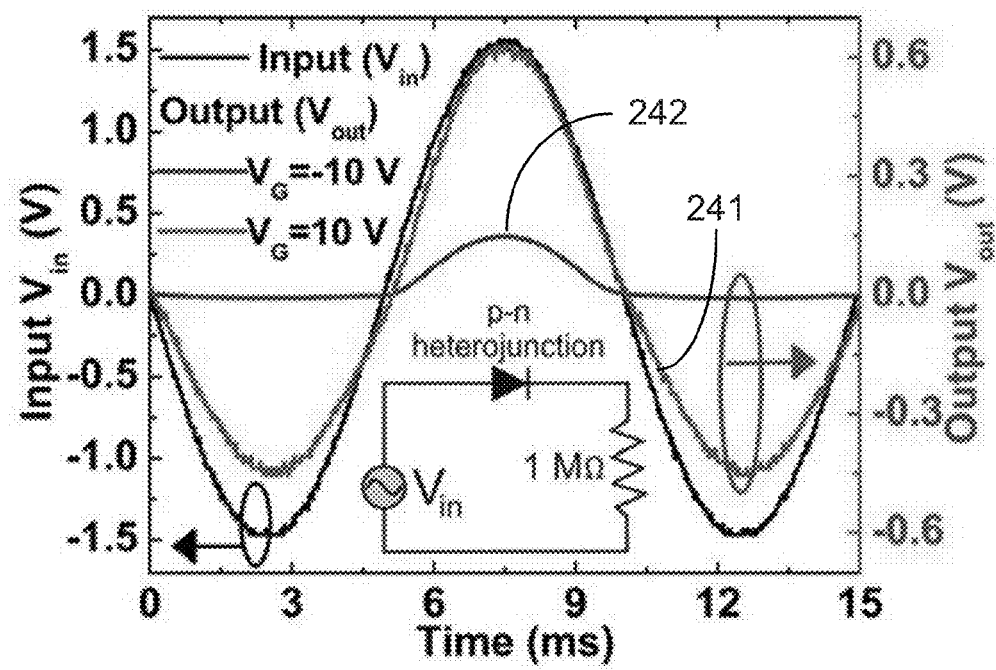

The gate dependence of the diode behavior enables gate-tunable rectifier circuits, as shown in FIG. 3D, which is a unique feature of the s-SWCNT/SL-MoS$_2$ heterojunction diode that has not been observed in conventional bulk semiconductor diodes. The p-n heterojunction diode was used as a half-wave rectifier using the circuit outlined in the inset of FIG. 3D. A 1 MΩ resistor was used in series with the diode to limit the current. A sinusoidal wave from a waveform generator was used as the input, while the output current was measured using a pre-amplifier (1211 DL Instruments) and the output voltage as it would appear across a 1 MΩ resistor, as shown in the inset of FIG. 3D. Time domain waveforms were captured using an oscilloscope.

Spatial Mapping of Photoluminescence and Raman Shift

A scanning confocal microscope (100× objective with NA=0.9, WiTec system) coupled to a tunable coherent white light source (NKT Photonics) was used to generate the spatially resolved photocurrent, which was converted into a voltage by a current preamplifier and recorded by either a lock-in amplifier (for imaging) or a digital sampling oscilloscope (for temporally resolved measurements). The heterojunction area was subjected to global illumination using the same apparatus with a 20× objective. The I-V characteristics under the global illumination were acquired using the same Keithley 2400 source meters and custom LabView programs.

Figure 4:
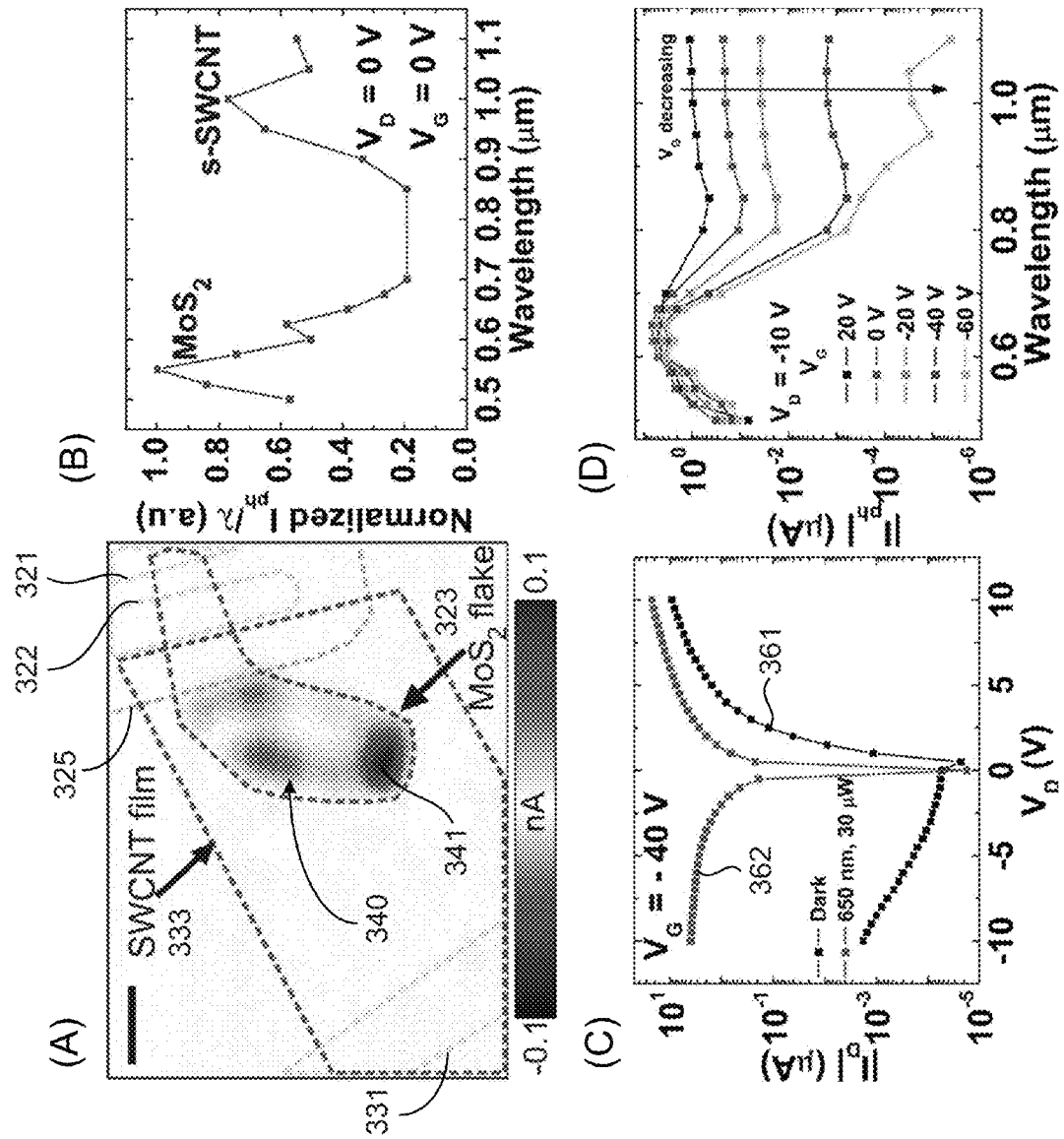
FIG. 4 shows a photoresponse of an s-SWCNTs/SL-$MoS_2$ p-n heterojunction diode according to one embodiment of the present invention. (A) Scanning photocurrent micrograph of the s-SWCNTs/SL-$MoS_2$ p-n heterojunction device showing the outlines of the SL-$MoS_2$ flake (outlined with a dashed line 323) and the patterned s-SWCNT film (outlined with a dashed line 333) acquired at 700 nm with 20 μW power. Regions of large negative photocurrent (341) are observed in the overlapping junction region (340). The patterned alumina is indicated by a dashed line 325 while electrodes are indicated by dashed lines 321, 322 and 331, respectively. (B) A photocurrent spectrum of the s-SWCNTs/SL-$MoS_2$ p-n heterojunction device under global illumination and zero bias conditions. The photocurrent magnitude is highest at the characteristic absorption energies of both SL-$MoS_2$ and s-SWCNTs. (C) An output curve of the s-SWCNTs/SL-$MoS_2$ p-n heterojunction device in the dark (361) and under global illumination at about 650 nm (362). (D) The photocurrent spectral response can be tuned with the gate voltage. With decreasing the gate voltage, the increased p-doping of the nanotubes and concomitant decreased n-doping of $MoS_2$ leads to a lower photocurrent in the near infrared region.

SL-MoS$_2$ and s-SWCNTs both have direct band gaps [11, 12] and show signatures of bound excitonic states in their absorption spectra [2, 12]. Therefore, photocurrent is expected upon optical irradiation of the p-n heterojunctions based on these materials. Towards that end, scanning photocurrent microscopy is employed to spatially map the local photoresponse of the s-SWCNT/SL-MoS$_2$ heterojunction device, as shown in FIG. 4A. The regions of high photocurrent intensity 341 lie in the heterojunction area 340 outlined by the SL-MoS$_2$ flake 323 overlapping with the patterned s-SWCNT film 333. The patterned alumina is indicated by a dashed line 325 while electrodes are indicated by dashed lines 321, 322 and 331, respectively. No measurable photocurrent is observed from the non-overlapping regions of either the s-SWCNT film, SL-MoS$_2$, or the electrical contacts, indicating that the photocurrent is generated by the vertical heterojunction 340.

Figure 11:
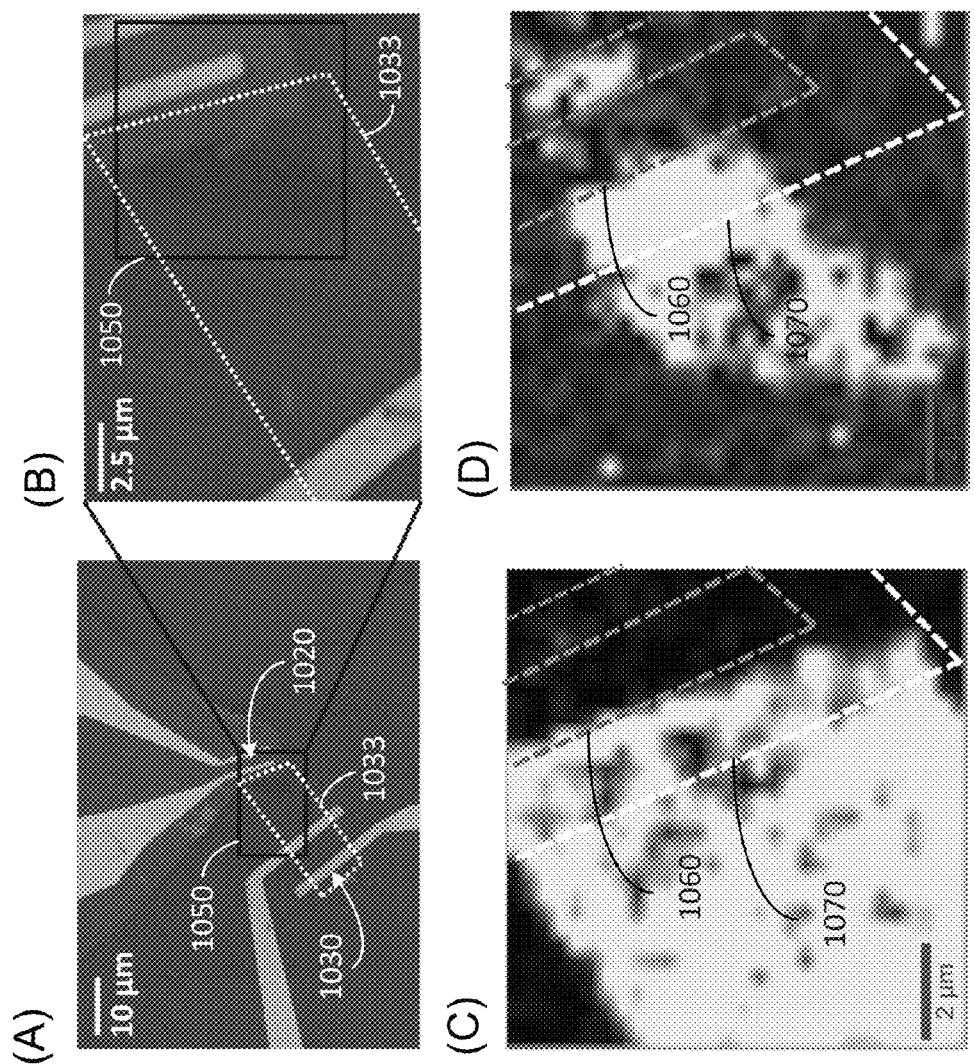
FIG. 11 shows (A) optical micrograph of a heterojunction device showing a SL-$MoS_2$ FET top right (1020) and s-SWCNT FET bottom left (1030) according to one embodiment of the present invention, where the white dotted outline 1033 indicates the extent of the patterned SWCNT film (scale bar=10 µm), (B) Zoom-in of the optical micrograph (A) representing the area scanned for spatial photocurrent mapping in FIG. 4A. The black dotted outline 1050 indicates the scanned area for spatial mapping of PL and Raman shift (scale bar=2.5 µm), (C) A spatial map of the Raman shift (3100-3250 $cm^{-1}$) showing the bright area as the patterned SWCNT film, where no Raman signal for the SWCNTs is observed in the $MoS_2$ contact or channel region marked by lines 1060, and the boundary 1070 indicates the extent of ALD grown alumina, and (D) A PL map of the SL-$MoS_2$ flake at the A peak (3700-3900 $cm^{-1}$), where the region of increased PL intensity represents the shape of the flake as seen in the optical images and the photocurrent map of FIG. 3A, no PL signal is observed in the contact regions, indicating PL quenching by the gold, and $MoS_2$ PL is also observed from the SL-$MoS_2$ FET channel area, between the contacts.

Spatial Raman and photoluminescence (PL) mapping was performed on the heterojunction device. A spatial map of the Raman 2G peak (3100-3250 cm$^{-1}$) from SWCNTs and photoluminescence from SL-MoS$_2$ at 3700-3900 cm$^{-1}$ (A peak) shows that the photocurrent arises only from the heterojunction region. It was also observed that that the PL signal was uniform in the heterojunction area of the MoS$_2$ flake as compared to the protected/masked area as shown in FIG. 11. FIG. 11A is an optical micrograph of the heterojunction device showing a SL-MoS$_2$ FET 1020 and s-SW-CNT FET 1030, where the white dotted outline 1033 indicates the extent of the patterned SWCNT film (scale bar=10 μm). FIG. 11B is a zoom-in of the optical micrograph of FIG. 11A representing the area scanned for spatial photocurrent mapping in FIG. 4A. The black dotted outline 1050 indicates the scanned area for spatial mapping of PL and Raman shift (scale bar=2.5 μm). FIG. 11C is a spatial map of the Raman shift (3100-3250 cm$^{-1}$) showing the bright area as the patterned SWCNT film, where no Raman signal for the SWCNTs is observed in the MoS$_2$ contact or channel region marked by lines 1060, and the boundary 1070 indicates the extent of ALD grown alumina. FIG. 11D shows a PL map of the SL-MoS$_2$ flake at the A peak (3700-3900 cm$^{-1}$), where the region of increased PL intensity represents the shape of the flake as seen in the optical images and the photocurrent map of FIG. 3A, no PL signal is observed in the contact regions, indicating PL quenching by the gold, and MoS$_2$ PL is also observed from the SL-MoS$_2$ FET channel area, between the contacts.

The spectral dependence of the photocurrent, as shown in FIG. 4B, correspond to the absorption peaks of SL-MoS$_2$ [13] and S$_{22}$ [23] peaks of s-SWCNTs, which demonstrates that this novel heterointerface can induce carrier separation following exciton and/or free carrier generation in either material.

To further illustrate the photoresponse of the s-SWCNT/SL-MoS$_2$ heterojunction, both output curve (I-V) and transfer curve (I-V$_g$) were acquired under global illumination at a series of wavelengths. A representative comparison of the dark (361) and illuminated (362) I-V curves at V$_G$=-40 V reveals that the photocurrent increases by 4 orders of magnitude at a heterojunction reverse bias of -5 V, as shown in FIG. 4C. FIG. 4D also shows the gate voltage dependent photocurrent values at a heterojunction reverse bias of -10 V. As the gate voltage becomes more negative, the relative contribution from the s-SWCNT portion of the spectrum decreases, which is consistent with the s-SWCNT/SL-MoS$_2$ heterojunction becoming a p$^+$-n$^-$ junction. This decrease could be due to a reduction in the rate of charge transfer due to changes in Fermi level differences across the heterojunction or a decrease in the depletion of the s-SWCNTs adjacent to the heterojunction leading to reduced efficiency of electron extraction.

Figure 5:
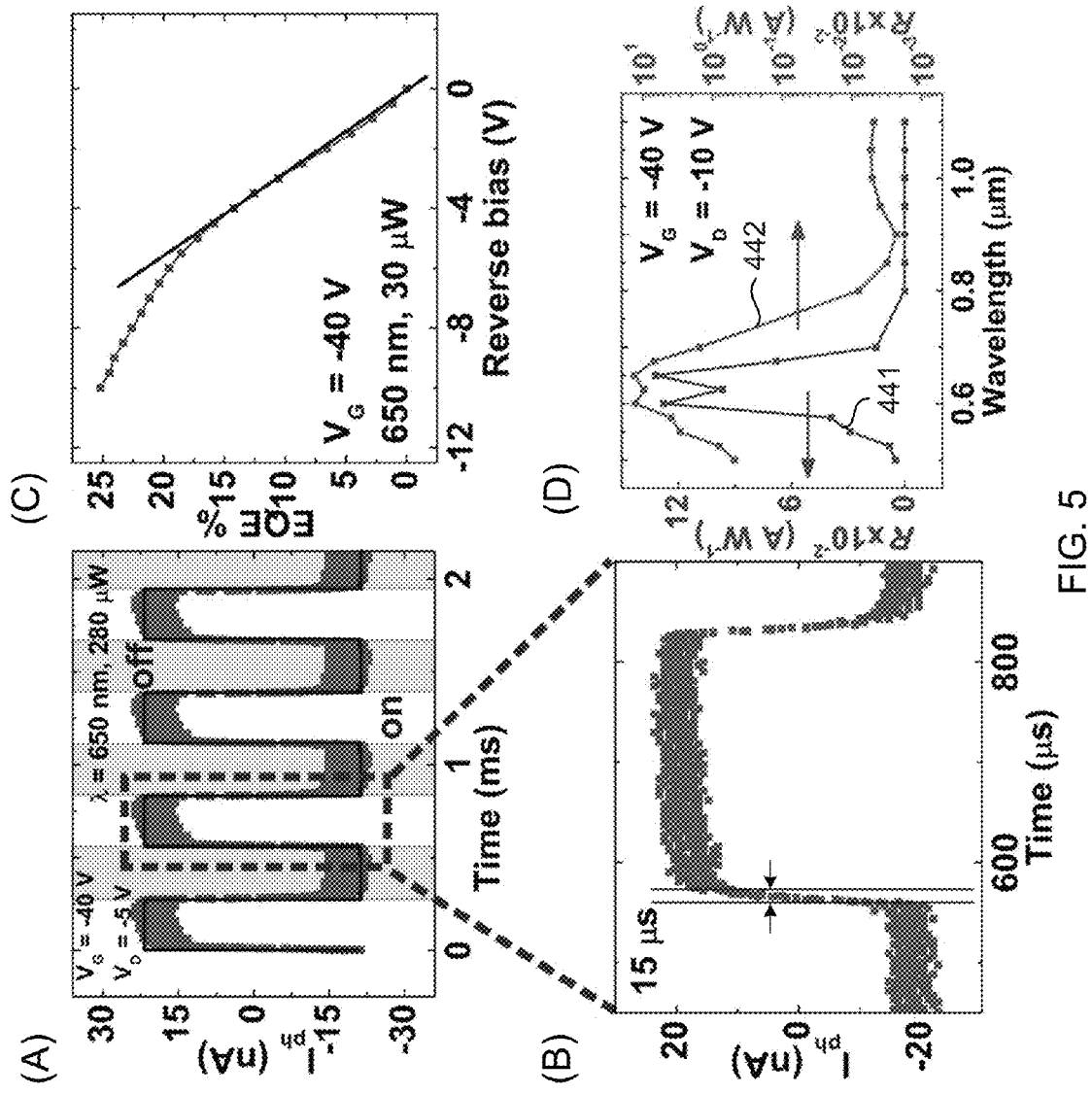
FIG. 5 shows photodetection using an s-SWCNTs/SL-$MoS_2$ p-n heterojunction device according to one embodiment of the present invention. (A) and (B) Time dependent photoresponse of the p-n heterojunction showing fast rise and decay times of about 15 μs. (C) External quantum efficiency (EQE) as a function of reverse bias for the heterojunction at about 650 nm. The EQE increases linearly with reverse bias from about 0 V to about –5 V with the highest EQE of about 25% occurring at about –10 V. (D) Spectrally dependent responsivity (R) of the photodiode in linear (441) and logarithmic (442) scales. A large responsivity is observed for the absorption wavelengths of SL-$MoS_2$ as compared to s-SWCNTs since the diode is being operated at $V_G$=–40 V (depletion mode of SL-$MoS_2$).

With a strong photoresponse, the s-SWCNT/SL-MoS$_2$ heterojunction can be exploited as a photodetector. Diode-based photodetectors are known for their fast photoresponse times compared to phototransistors since the photoexcited carriers must only traverse a distance equal to the depletion width of the junction. Indeed, a fast photoresponse, less than about 15 μs, was observed from the s-SWCNT/SL-MoS$_2$ heterojunction, as shown in FIGS. 5A and 5B. Importantly, this photoresponse time is orders of magnitude smaller than recently reported heterojunction phototransistors based on graphene [24]. Furthermore, the s-SWCNT/SL-MoS$_2$ heterojunction photoresponse time observed here is limited by the rise time of the preamplifier used in the experiment, and thus 15 μs represents an upper bound.

Responsivity and Quantum Efficiency

The external quantum efficiency (EQE) of the s-SWCNT/SL-MoS$_2$ heterojunction photodetector is also noteworthy (about 25% at V$_D$=-10 V) and compares favorably to other recently reported 2D nanomaterial heterostructures, as shown in FIG. 5C [24-26].

The EQE is calculated as $$EQE = \frac{I_{ph}/e}{P/h\nu} \times 100,$$

where I$_{ph}$, e, P, and hν represent the photocurrent, electronic charge, incident optical power, and photon energy, respectively. The photocurrent was extracted by subtracting the dark I-V curves from the illuminated I-V curves. The responsivity (R) was calculated using R=EQE×1.24/λ, where λ is in μm.

The linear rise in EQE at low reverse biases shown in FIG. 5C is similar to the behavior of quantum dot (QD) based photodiodes [27], which was related to changes in the depletion region. Here, given the negligible thickness of SL-MoS$_2$ compared to the expected depletion width [28], the increasing EQE is attributed to an increase in the rate of charge transfer across the heterojunction interface due to the change in band alignment, rather than an increase in the depletion width. The spectral responsivity (R) of the heterojunction photodetector is presented in FIG. 5D. The highest R exceeds 0.1 A/W at a wavelength of 650 nm, which is comparable to other nanostructured diode-based photodetectors in the literature [29]. The combination of high R and fast photoresponse time presents advantages over currently available organic and QD photodiodes [27].

Power Dependence of Photocurrent

Figure 12:
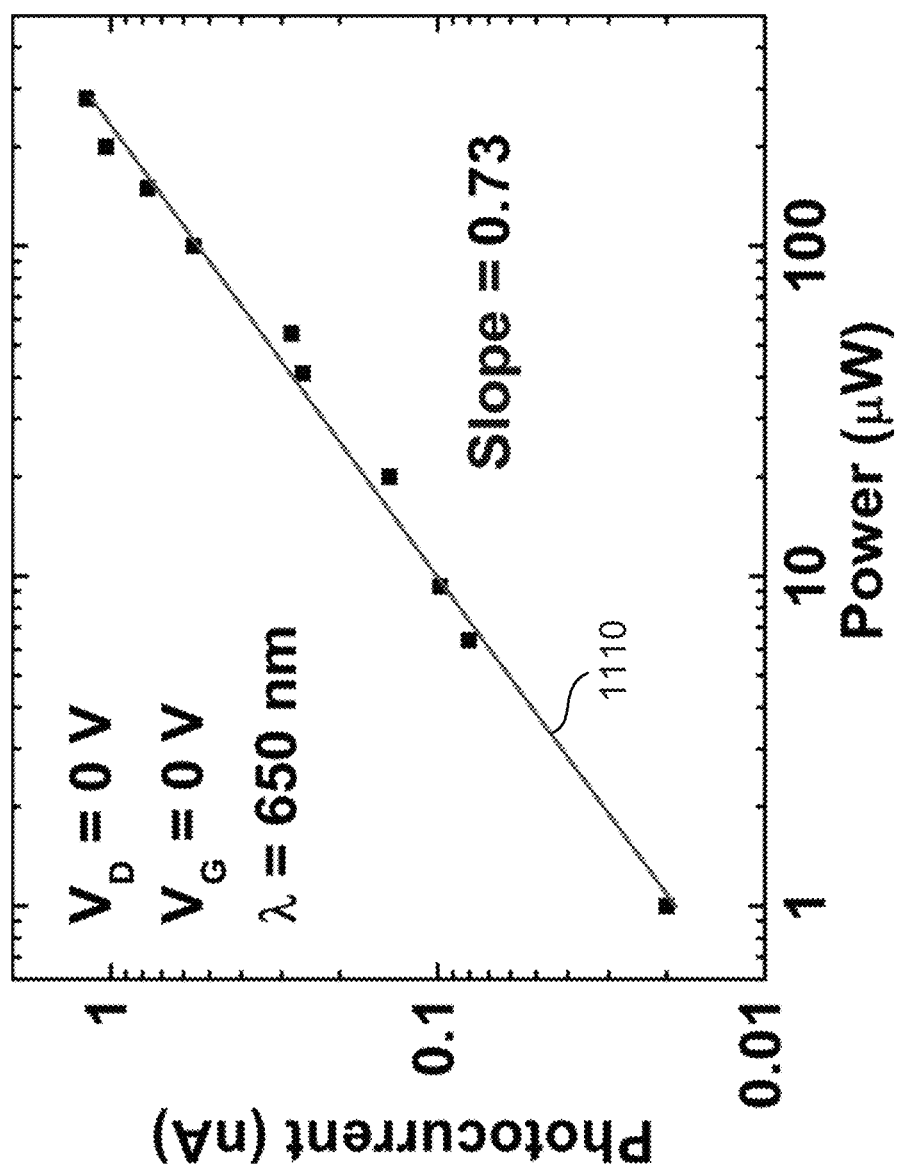
FIG. 12 shows power dependence of the photocurrent of the exemplary p-n heterojunction diode under zero applied bias. The line 1110 is a linear fit to the data showing a slope of 0.73.

The power dependence of the photocurrent was measured under zero bias using the same illumination system. The power dependence is sub-linear which is consistent with bimolecular recombination of electrons and holes, further implying that the concentration of photogenerated carriers is similar to or greater than the intrinsic carrier concentration [33]. FIG. 12 shows power dependence of the photocurrent under zero applied bias. The line 1110 is a linear fit to the data showing a slope of 0.73.

In sum, the present invention recites, among other things, a gate-tunable p-n heterojunction diode through the integration of p-type s-SWCNTs and n-type SL-MoS$_2$. The ultrathin nature of the constituent materials implies that both components can be modulated by a capacitively coupled gate bias, thereby enabling wide tunability of charge transport from a nearly insulating state to a highly rectifying condition with forward-to-reverse bias current ratios exceeding 10$^4$. When operated as a three-terminal device, the p-n heterojunction diode also shows 'anti-ambipolar' behavior with current on/off ratios greater than 10$^4$, suggesting its utility in advanced logic applications. Furthermore, since s-SWCNTs and SL-MoS$_2$ are direct band gap semiconductors, the p-n heterojunction diode serves as an effective photodetector with fast photoresponse less than about 15 μs. By combining other chirality-resolved s-SWCNTs [30] with the growing list of 2D semiconductor nanomaterials [14], the p-n heterojunction diode can be generalized to a wide range of electronic and optoelectronic applications.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

LISTING OF REFERENCES

[1]. Schwierz, F. Graphene transistors. *Nat. Nanotechnol.* 5, 487-496 (2010).
[2]. Jariwala, D., Sangwan, V. K., Lauhon, L. J., Marks, T. J. and Hersam, M. C. Carbon nanomaterials for electronics, optoelectronics, photovoltaics, and sensing. *Chem. Soc. Rev.* 42, 2824-2860 (2013).
[3]. Radisavljevic, B., Radenovic, A., Brivio, J., Giacometti, V. and Kis, A. Single-layer $MoS_2$ transistors. *Nat. Nanotechnol.* 6, 147-150 (2011).
[4]. Wang, H. et al. Integrated circuits based on bilayer $MoS_2$ transistors. *Nano Lett.* 12, 4674-4680 (2012).
[5]. Dean, C. et al. Boron nitride substrates for high-quality graphene electronics. *Nat. Nanotechnol.* 5, 722-726 (2010).
[6]. Britnell, L. et al. Field-effect tunneling transistor based on vertical graphene heterostructures. *Science* 335, 947-950 (2012).
[7]. Yu, W. J. et al. Vertically stacked multi-heterostructures of layered materials for logic transistors and complementary inverters. *Nat. Mater.* 12, 246-252 (2012).
[8]. Georgiou, T. et al. Vertical field-effect transistor based on graphene-WS2 heterostructures for flexible and transparent electronics. *Nat. Nanotechnol.* 8, 100-103 (2012).
[9]. Bertolazzi, S., Krasnozhon, D. and Kis, A. Nonvolatile Memory Cells Based on $MoS_2$/Graphene Heterostructures. *ACS Nano* 7, 3246-3252 (2013).
[10]. Choi, M. S. et al. Controlled charge trapping by molybdenum disulphide and graphene in ultrathin heterostructured memory devices. *Nat. Commun.* 4, 1624 (2013).
[11]. O'connell, M. J. et al. Band gap fluorescence from individual single-walled carbon nanotubes. *Science* 297, 593-596 (2002).
[12]. Mak, K. F., Lee, C., Hone, J., Shan, J. and Heinz, T. F. Atomically Thin $MoS_2$: A New Direct-Gap Semiconductor. *Phys. Rev. Lett.* 105, 136805 (2010).
[13]. Mak, K. F. et al. Tightly bound trions in monolayer $MoS_2$. *Nat. Mater.* 12, 207-211 (2012).
[14]. Wang, Q. H., Kalantar-Zadeh, K., Kis, A., Coleman, J. N. and Strano, M. S. Electronics and optoelectronics of two-dimensional transition metal dichalcogenides. *Nat. Nanotechnol.* 7, 699-712 (2012).
[15]. Yang, H. et al. Graphene barristor, a triode device with a gate-controlled Schottky barrier. *Science* 336, 1140-1143 (2012).
[16]. Britnell, L. et al. Resonant tunnelling and negative differential conductance in graphene transistors. *Nat. Commun.* 4, 1794 (2013).
[17]. Ponomarenko, L. et al. Tunable metal-insulator transition in double-layer graphene heterostructures. *Nat. Phys.* 7, 958-961 (2011).
[18]. Levendorf, M. P. et al. Graphene and boron nitride lateral heterostructures for atomically thin circuitry. *Nature* 488, 627-632 (2012).
[19]. Ci, L. et al. Atomic layers of hybridized boron nitride and graphene domains. *Nat. Mater.* 9, 430-435 (2010).
[20]. Liu, Z. et al. In-plane heterostructures of graphene and hexagonal boron nitride with controlled domain sizes. *Nat. Nanotechnol.* 8, 119-124 (2013).
[21]. Collins, P. G., Bradley, K., Ishigami, M. and Zettl, A. Extreme oxygen sensitivity of electronic properties of carbon nanotubes. *Science* 287, 1801-1804 (2000).
[22]. Sangwan, V. K. et al. Fundamental Performance Limits of Carbon Nanotube Thin-Film Transistors Achieved Using Hybrid Molecular Dielectrics. *ACS Nano* 6, 7480-7488 (2012).
[23]. Arnold, M. S., Green, A. A., Hulvat, J. F., Stupp, S. I. and Hersam, M. C. Sorting carbon nanotubes by electronic structure using density differentiation. *Nat. Nanotechnol.* 1, 60-65 (2006).
[24]. Konstantatos, G. et al. Hybrid graphene-quantum dot phototransistors with ultrahigh gain. *Nat. Nanotechnol.* 7, 363-368 (2012).
[25]. Britnell, L. et al. Strong Light-Matter Interactions in Heterostructures of Atomically Thin Films. *Science*, doi: 10.1126/science.1235547 (2013).
[26]. Zhang, W. et al. Ultrahigh-Gain Phototransistors Based on Graphene-$MoS_2$ Heterostructures. *arXiv preprint arXiv:* 1302.1230 (2013).
[27]. Rauch, T. et al. Near-infrared imaging with quantum-dot-sensitized organic photodiodes. *Nat. Photon.* 3, 332-336 (2009).
[28]. Li, Y., Xu, C.-Y. and Zhen, L. Surface potential and interlayer screening effects of few-layer $MoS_2$ nanoflakes. *Appl. Phys. Lett.* 102, 143110-143114 (2013).
[29]. Konstantatos, G. and Sargent, E. H. Nanostructured materials for photon detection. *Nat. Nanotechnol.* 5, 391-400 (2010).
[30]. Green, A. A. and Hersam, M. C. Nearly Single-Chirality Single-Walled Carbon Nanotubes Produced via Orthogonal Iterative Density Gradient Ultracentrifugation. *Adv. Mater.* 23, 2185-2190 (2011).
[31]. Lee, C. et al. Anomalous Lattice Vibrations of Single- and Few-Layer $MoS_2$. *ACS Nano* 4, 2695-2700 (2010).
[32]. Jariwala, D. et al. Band-like transport in high mobility unencapsulated single-layer $MoS_2$ transistors. *Appl. Phys. Lett.* 102, 173107-173104 (2013).
[33]. Bube, R. H. *Photoelectronic properties of semiconductors*. (Cambridge University Press, 1992).

What is claimed is:
1. A gate-tunable p-n junction diode, comprising:
a substrate;
a first semiconductor layer of molybdenum disulphide ($MoS_2$) flakes having a first portion and a second portion extending from the first portion, formed on the substrate, the first semiconductor layer having a first band gap being greater than 0 eV;
a second semiconductor layer of single-walled carbon nanotubes (SWCNTs) having a first portion and a second portion extending from the first portion, formed on the substrate, such that the second portion of the first semiconductor layer of SWCNTs and the second portion of the second semiconductor layer of $MoS_2$ flakes are in directly contact and overlap with one another to define a vertically stacked heterojunction therewith, the second semiconductor layer having a second band gap being greater than 0 eV; and a first electrode and a second electrode formed on the substrate, being in contact with the first portion of the first semiconductor layer of MoS$_2$ flakes and the first portion of the second semiconductor layer of SWCNTs, respectively, such that the vertically stacked heterojunction is located between the first electrode and the second electrode, wherein the MoS$_2$ flakes and SWCNTs are n-type and p-type semiconductors, respectively.

2. The diode of claim 1, wherein the first semiconductor layer of MoS$_2$ flakes has a monolayer thickness.

3. The diode of claim 1, wherein the second semiconductor layer of SWCNTs is formed of sorted semiconducting SWCNTs.

4. The diode of claim 1, wherein the substrate comprises a gate layer of silicon and an insulating layer of silicon oxide (SiO$_2$) formed on the gate layer, wherein the layer of MoS$_2$ flakes, the layer of SWCNTs, the first electrode and the second electrode are disposed on the insulating layer.

5. The diode of claim 4, wherein a ratio of a forward current to a reverse current of the diode varies as a function of a gate voltage applied to the gate layer.

6. The diode of claim 5, wherein electrical characteristics of the diode are tunable with the applied gate voltage over a wide range of charge transport behavior ranging from insulating to rectifying with the forward-to-reverse bias current ratio exceeding 10$^4$.

7. The diode of claim 6, wherein the diode is capable of functioning as an insulator, a linear-response resistor, or a highly rectifying diode, in response to the applied gate voltage.

8. The diode of claim 4, wherein the diode has an optical response to optical illumination of light at a wavelength ranging from near-infrared wavelength to a visible wavelength.

9. The diode of claim 8, wherein the diode has a photoresponse time that is less than about 15 µs, and an external quantum efficiency (EQE) that is greater than about 25%.

10. An electronic device, comprising at least one diode as recited in claim 1.

11. A photodetector, comprising at least one diode as recited in claim 1.

12. A gate-tunable p-n junction diode, comprising:
a substrate;
a first semiconductor layer formed of a first semiconductor having a first band gap, having a first portion and a second portion extending from the first portion, formed on the substrate;
a second semiconductor layer formed of a second semiconductor having a second band gap, having a first portion and a second portion extending from the first portion, formed on the substrate, such that the second portion of the second semiconductor layer and the second portion of the first semiconductor layer are in directly contact and overlap with one another to define a vertically stacked heterojunction therewith; and
a first electrode and a second electrode formed on the substrate, being in contact with the first portion of the first semiconductor layer and the first portion of the second semiconductor layer, respectively, such that the vertically stacked heterojunction is located between the first electrode and the second electrode,
wherein each of the first band gap and the second band gap is greater than 0 eV;

wherein one of the first semiconductor and the second semiconductor is an n-type semiconductor, and the other of the first semiconductor and the second semiconductor is a p-type semiconductor;
wherein each of the first semiconductor layer and the second semiconductor layer has a monolayer thickness; and
wherein the n-type semiconductor comprises molybdenum disulphide (MoS$_2$) flakes, and the p-type semiconductor comprises single-walled carbon nanotubes (SWCNTs).

13. The diode of claim 12, wherein each of the first semiconductor layer and the second semiconductor layer is formed of an atomically thin semiconductor.

14. The diode of claim 12, wherein the n-type semiconductor has a band gap that is larger than that of the p-type semiconductor.

15. The diode of claim 12, wherein the substrate comprises a gate layer of silicon and an insulating layer of silicon oxide (SiO$_2$) formed on the gate layer, wherein the first semiconductor layer, the second semiconductor layer, the first electrode and the second electrode are disposed on the insulating layer.

16. The diode of claim 15, wherein a ratio of a forward current to a reverse current of the diode varies as a function of a gate voltage applied to the gate layer.

17. The diode of claim 16, wherein electrical characteristics of the diode are tunable with the applied gate voltage over a wide range of charge transport behavior ranging from insulating to rectifying with the forward-to-reverse bias current ratio exceeding 10$^4$.

18. The diode of claim 17, wherein the diode is capable of functioning as an insulator, a linear-response resistor, or a highly rectifying diode, in response to the applied gate voltage.

19. The diode of claim 15, wherein the diode has an optical response to optical illumination of light at a wavelength ranging from near-infrared wavelength to a visible wavelength.

20. The diode of claim 19, wherein the diode has a photoresponse time that is less than about 15 µs, and an external quantum efficiency (EQE) that is greater than about 25%.

21. An electronic device, comprising at least one diode as recited in claim 12.

22. A photodetector, comprising at least one diode as recited in claim 12.

23. A heterojunction structure, comprising:
a first semiconductor layer formed of a first semiconductor having a first band gap and a second semiconductor layer formed of a second semiconductor having a second band gap and being directly stacked on and in directly contact with the first semiconductor layer to define a vertically stacked heterojunction on a substrate,
wherein each of the first band gap and the second band gap is greater than 0 eV;
wherein one of the first semiconductor and the second semiconductor is an n-type semiconductor, and the other of the first semiconductor and the second semiconductor is a p-type semiconductor;
wherein each of the first semiconductor layer and the second semiconductor layer is formed of an atomically thin semiconductor; and wherein the n-type semiconductor comprises molybdenum disulphide (MoS$_2$) flakes, and the p-type semiconductor comprises single-walled carbon nanotubes (SWCNTs).

24. The heterojunction structure of claim 23, wherein each of the first semiconductor layer and the second semiconductor layer has a monolayer thickness.

25. The heterojunction structure of claim 23, wherein the n-type semiconductor has a band gap that is larger than that of the p-type semiconductor.

26. The heterojunction structure of claim 23, wherein the substrate comprises a gate layer and an insulating layer formed on the gate layer, wherein the first semiconductor layer and the second first semiconductor layer are disposed on the insulating layer.

27. The heterojunction structure of claim 26, wherein the heterojunction structure has an optical response to optical illumination of light at a wavelength ranging from near-infrared wavelength to a visible wavelength.

28. The heterojunction structure of claim 27, wherein the heterojunction structure has a photoresponse time that is less than about 15 μs, and an external quantum efficiency (EQE) that is greater than about 25%.

29. The heterojunction structure of claim 26, wherein a ratio of a forward current to a reverse current of the heterojunction structure varies as a function of a gate voltage applied to the gate layer.

30. An electronic device, comprising at least one heterojunction structure as recited in claim 23.

31. A photodetector, comprising at least one heterojunction structure as recited in claim 23.

32. A heterojunction structure, comprising:
a first semiconductor layer formed of a first semiconductor having a first band gap and a second semiconductor layer formed of a second semiconductor having a second band gap and being directly stacked on and in directly contact with the first semiconductor layer to define a vertically stacked heterojunction on a substrate,
wherein each of the first band gap and the second band gap is greater than 0 eV;
wherein one of the first semiconductor and the second semiconductor is an n-type semiconductor, and the other of the first semiconductor and the second semiconductor is a p-type semiconductor;
wherein each of the first semiconductor layer and the second semiconductor layer is formed of an atomically thin semiconductor;
wherein the substrate comprises a gate layer and an insulating layer formed on the gate layer, wherein the first semiconductor layer and the second first semiconductor layer are disposed on the insulating layer;
wherein a ratio of a forward current to a reverse current of the heterojunction structure varies as a function of a gate voltage applied to the gate layer; and
wherein electrical characteristics of the heterojunction structure are tunable with the applied gate voltage over a wide range of charge transport behavior ranging from insulating to rectifying with the forward-to-reverse bias current ratio exceeding $10^4$.

33. The heterojunction structure of claim 32, wherein the heterojunction structure is capable of functioning as an insulator, a linear-response resistor, or a highly rectifying diode, in response to the applied gate voltage.

* * * * *